US012580563B2

(12) United States Patent
Matsumoto

(10) Patent No.: US 12,580,563 B2
(45) Date of Patent: Mar. 17, 2026

(54) SEMICONDUCTOR DEVICE

(71) Applicant: ROHM CO., LTD., Kyoto (JP)

(72) Inventor: Naoki Matsumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 50 days.

(21) Appl. No.: 18/632,581

(22) Filed: Apr. 11, 2024

(65) Prior Publication Data

US 2024/0259015 A1 Aug. 1, 2024

Related U.S. Application Data

(63) Continuation of application No. PCT/JP2022/032511, filed on Aug. 30, 2022.

(30) Foreign Application Priority Data

Nov. 8, 2021 (JP) ................................. 2021-181609

(51) Int. Cl.
 *H02M 1/08* (2006.01)
 *H03K 17/12* (2006.01)
 *H03K 17/16* (2006.01)
(52) U.S. Cl.
 CPC ......... *H03K 17/168* (2013.01); *H03K 17/127* (2013.01); *H02M 1/08* (2013.01); *H03K 2217/0063* (2013.01); *H03K 2217/0072* (2013.01)
(58) Field of Classification Search
 CPC ..... H02M 1/08; H03K 17/127; H03K 17/168; H03K 2217/0063; H03K 2217/0072
 USPC .......................................... 327/108, 109, 110
 See application file for complete search history.

(56) References Cited

U.S. PATENT DOCUMENTS 11,043,943 B2 * 6/2021 Vemulapati .......... H03K 17/567
2013/0257177 A1 * 10/2013 Jacobson ......... H03K 17/04123
                                                          307/115
2015/0116024 A1 * 4/2015 Ishikawa ............... H02M 1/088
                                                          327/419

(Continued)

FOREIGN PATENT DOCUMENTS

EP         3240177      11/2017
JP        2014117109      6/2014

(Continued)

OTHER PUBLICATIONS

International Search Report and Written Opinion in International Appln. No. PCT/JP2022/032511, mailed on Nov. 8, 2022, 19 pages (with machine translation).

(Continued)

*Primary Examiner* — William Hernandez
(74) *Attorney, Agent, or Firm* — Fish & Richardson P.C.

(57) ABSTRACT

A semiconductor device includes: a switching element including a parallel connection circuit of a first transistor configured as a field-effect transistor and a second transistor configured as an insulated-gate bipolar transistor; and a driver circuit configured to drive the switching element according to an input control signal. When turning the switching element from a first state to a second state, the driver circuit turns, at different timings, the first transistor from the first state to the second state and the second transistor from the first state to the second state. Of the first and second states, one is an off state and the other is an on state.

11 Claims, 16 Drawing Sheets

(56) References Cited

U.S. PATENT DOCUMENTS

2022/0103167 A1* 3/2022 Wang ..................... H03K 17/16
2024/0007097 A1* 1/2024 Onodera .......... H01L 23/49562

FOREIGN PATENT DOCUMENTS

| JP | 2018157712 | 10/2018 |
| JP | 2020108225 | 7/2020 |
| WO | WO 2016103328 | 6/2016 |

OTHER PUBLICATIONS

International Search Report and Written Opinion in International Appln. No. PCT/US2009/042061, mailed on Nov. 8, 2022, 19 pages (with machine translation).

* cited by examiner $dff\_Hon = \triangle d\_H2 - \triangle d\_H1$ $dff\_Hoff = \triangle d\_H4 - \triangle d\_H3$ dff_Lon = △d_L2 − △d_L1 dff_Loff = △d_L4 − △d_L3

SEMICONDUCTOR DEVICE

CROSS-REFERENCE TO RELATED APPLICATIONS

This nonprovisional application is a continuation application of International Patent Application No. PCT/JP2022/032511 filed on Aug. 30, 2022, which claims priority Japanese Patent Application No. 2021-181609 filed on Nov. 8, 2021, the entire contents of which are hereby incorporated by reference.

TECHNICAL FIELD

The present disclosure relates to semiconductor devices.

BACKGROUND ART

Devices that drive a load (such as a coil) using a switching element are known.

CITATION LIST

Patent Literature

Patent Document 1: JP-A-2014-117109

DESCRIPTION OF EMBODIMENTS

Figure 1:
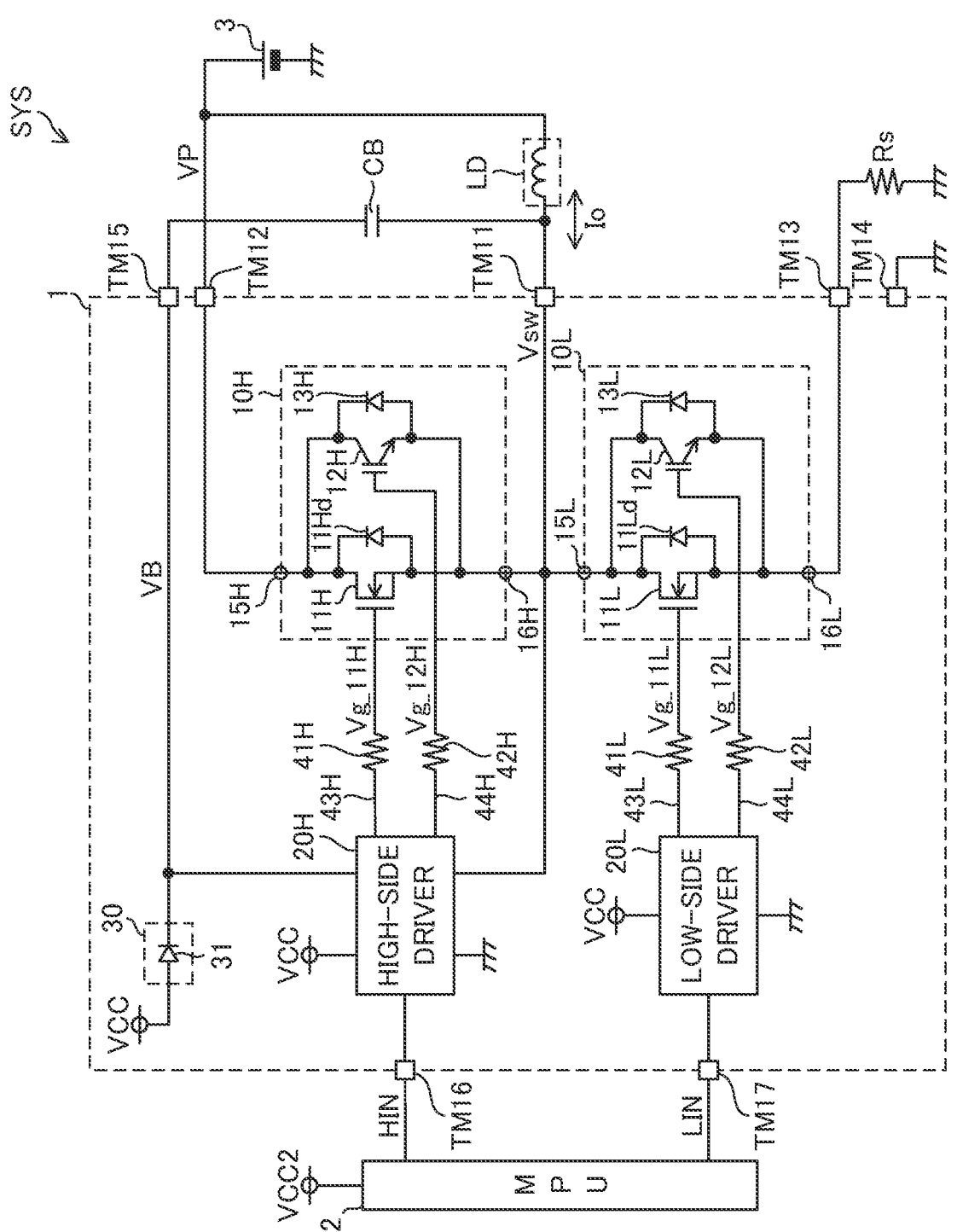
FIG. 1 is an overall configuration diagram of a system (load driving system) according to an embodiment of the present disclosure.

Examples of implementing the present disclosure will be specifically described below with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the high-side switching element described later and identified by the reference sign "10H" (see FIG. 1) is sometimes referred to as "high-side switching element 10H" and other times abbreviated to "switching element 10H", both referring to the same entity.

First, some of the terms used to describe embodiments of the present disclosure will be defined. "Ground" denotes a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" is a potential higher than "low level". For any signal or voltage of interest, its being at high level means, more precisely, its level being equal to high level, and its being at low level means, more precisely, its level being equal to low level. A level with respect to a signal is occasionally referred to as a signal level, and a level with respect to a voltage is occasionally referred to as a voltage level.

For any signal or voltage of interest, a switch from low level to high level is termed an up edge (or rising edge) and the timing of a switch from low level to high level is termed an up edge timing (or rising edge timing). Likewise, for any signal or voltage of interest, a switch from high level to low level is termed a down edge (or falling edge) and the timing of a switch from high level to low level is termed a down edge timing (or falling edge timing).

For any signal that takes as its signal level high or low level, a period in which the signal is at high level is referred to as a high-level period and a period in which the signal is at low level is referred to as a low-level period. The same applies to any voltage that takes as its voltage level high or low level.

For any transistor configured as an FET (field-effect transistor), which can be a MOSFET, "on state" refers to a state where the transistor is conducting between its drain and source, and "off state" refers to a state where the transistor is not conducting (is cut off) between its drain and source. Unless otherwise stated, any MOSFET can be understood to be an enhancement MOSFET. "MOSFET" is an abbreviation of "metal-oxide-semiconductor field-effect transistor". Unless otherwise stated, for any MOSFET its back gate is understood to be short-circuited to its source.

The electrical characteristics of a MOSFET include a gate threshold voltage. For an N-channel MOSFET, when the gate potential of the MOSFET is higher than the source potential of the MOSFET and the magnitude of the gate-source voltage of the MOSFET is equal to or higher than the gate threshold voltage of the MOSFET, the MOSFET is in the on state; otherwise, the MOSFET is in the off state. For any MOSFET, the gate-source voltage denotes the potential of the gate relative to the potential of the source.

For any transistor configured as an IGBT, an on state denotes a state where the transistor is conducting between its collector and emitter, and an off state denotes a state where the transistor is not conducting (is cut off) between its collector and emitter. "IGBT" is an abbreviation of "insulated-gate bipolar transistor".

The electrical characteristics of an IGBT include a gate threshold voltage. For an N-channel IGBT, when the gate potential of the IGBT is higher than the emitter potential of the IGBT and the magnitude of the gate-emitter voltage of the IGBT is equal to or higher than the gate threshold voltage of the IGBT, the IGBT is in the on state; otherwise, the IGBT is in the off state. For any IGBT, the gate-emitter voltage denotes the potential of the gate relative to the potential of emitter.

Unless otherwise stated, wherever "connection" is discussed among a plurality of parts constituting a circuit, as among given circuit elements, wirings, nodes, and the like, the term is to be understood to denote "electrical connection".

FIG. 1 shows an overall construction of a system SYS according to a first embodiment. The system SYS can be called a load driving system. The system SYS includes a semiconductor device 1 for driving a load LD, an MPU (microprocessor unit) 2, and a voltage source 3, and further includes a capacitor CB and a sense resistor Rs. The semiconductor device 1 can be called a load driving device, or a load driving semiconductor device.

Figure 2:
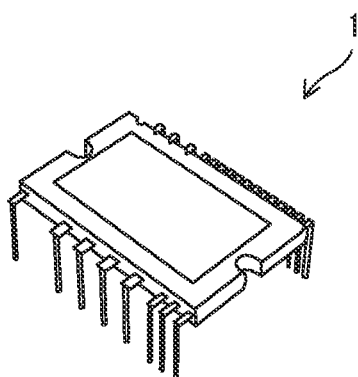
FIG. 2 is an exterior perspective view of a semiconductor device according to an embodiment of the present disclosure.

FIG. 2 is an exterior perspective view of the semiconductor device 1. The semiconductor device 1 is an electronic component that includes a semiconductor chip having a semiconductor integrated circuit formed on a semiconductor substrate, semiconductor discrete components, a package (case) housing the semiconductor chip and the semiconductor discrete components, and a plurality of external terminals exposed out of the package to outside the semiconductor device 1. Sealing the semiconductor chip and the semiconductor discrete components in the package (case) formed of resin yields the semiconductor device 1. A semiconductor device 1 of this type can be called an IPM (intelligent power module). The number of external terminals, and the type of package, of the semiconductor device 1 shown in FIG. 2 are merely illustrative, and can be designed as desired.

As some of the external terminals provided on the semiconductor device 1, FIG. 1 shows terminals TM11 to TM17. The terminal TM11 is an output terminal to which an output terminal voltage Vsw is applied. The terminal TM12 is a power supply terminal to which a power supply voltage VP is applied. The terminal TM13 is a low-side terminal. The terminal TM14 is a ground terminal connected to a ground. The terminal TM15 is a boot terminal to which a boot voltage VB is applied. The terminal TM16 is a control input terminal to which a driving control signal HIN is applied. The terminal TM17 is a control input terminal to which a driving control signal LIN is applied. The driving control signals HIN and LIN are input control signals for the semiconductor device 1.

First, the configuration outside the semiconductor device 1 will be described. A load LD is connected to the output terminal TM11 and operates based on the electric power supplied via the output terminal TM11. The load LD includes an inductive load. Here, it is assumed that one terminal of a coil as the load LD is connected to the output terminal TM11 and that the other terminal of the coil as the load LD is connected to a wiring to which the power supply voltage VP is applied. The load LD can be a coil (armature winding) in a motor. The load LD can be any load that includes an inductive load. In the following description, the current that passes between the output terminal TM11 and the load LD will be referred to as a load current and be identified by the symbol "Io".

The capacitor CB is a bootstrap capacitor provided outside the semiconductor device 1. Outside the semiconductor device 1, the capacitor CB is provided between the terminals TM11 and TM15. Specifically, one terminal of the capacitor CB is connected to the output terminal TM11, and the other terminal of the capacitor CB is connected to the boot terminal TM15. A modification is possible where the capacitor CB is incorporated in the semiconductor device 1.

The voltage source 3 outputs a supply voltage VP with a predetermined positive direct-current voltage value. The supply voltage VP will occasionally be referred to as the power supply voltage. The power supply voltage VP is fed to the power supply terminal TM12. The supply voltage VP can have any voltage value. The supply voltage VP is, for example, several hundred volts.

The low-side terminal TM13 is connected via the sense resistor Rs to the ground. A modification is possible where the sense resistor Rs is incorporated in the semiconductor device 1. The low-side terminal TM13 can be connected directly to the ground. In the semiconductor device 1, the voltage drop across the sense resistor Rs can be monitored as a basis for overcurrent protection operation for a switching element 10H or 10L, which will be described later. Note however that the sense resistor Rs can be omitted from the system SYS (the sense resistor Rs can be understood to have a resistance value of 0Ω).

The MPU 2 generates and outputs the driving control signals HIN and LIN. The driving control signal HIN is fed to the control input terminal TM16 and the driving control signal LIN is fed to the control input terminal TM17. The driving control signals HIN and LIN are each a digital signal (binary signal) that takes high or low level. The high level of the driving control signals HIN and LIN is equal to the level of a supply voltage VCC2 for the MPU 2, and the low level of the driving control signals HIN and LIN is equal to the level of the ground (see FIG. 3). Here, "equal" is to be understood to cover "substantially equal". The supply voltage VCC2 can have any voltage value. The supply voltage VCC2 is, for example, 5 V (volts).

Next, the configuration inside the semiconductor device 1 will be described. As shown in FIG. 1, the semiconductor device 1 includes a high-side switching element 10H and a low-side switching element 10L, a high-side driver 20H and a low-side driver 20L, a boot circuit 30, and gate resistors 41H, 42H, 41L, and 42L.

The switching elements 10H and 10L are each a composite switching element that includes a parallel connection circuit of a field-effect transistor and an insulated-gate bipolar transistor.

More specifically, the switching element 10H includes a transistor 11H which is an N-channel MOSFET, a transistor 12H which is an N-channel IGBT, and a diode 13H which is a Schottky barrier diode. The transistors 11H and 12H and the diode 13H can be formed as semiconductor discrete components. A parasitic diode that accompanies the transistor 11H is represented as a diode 11Hd. The switching element 10H has terminals 15H and 16H. The drain of the transistor 11H, the collector of the transistor 12H, and the cathode of the diode 13H are all connected to the terminal 15H. The source of the transistor 11H, the emitter of the transistor 12H, and the anode of the diode 13H are all connected to the terminal 16H. The anode and the cathode of the parasitic diode 11Hd are connected to the source and the drain, respectively, of the transistor 11H.

The switching element 10L includes a transistor 11L which is an N-channel MOSFET, a transistor 12L which is an N-channel IGBT, and a diode 13L which is a Schottky barrier diode. The transistors 11L and 12L and the diode 13L can be formed as semiconductor discrete components. A parasitic diode that accompanies the transistor 11L is represented as a diode 11Ld. The switching element 10L has terminals 15L and 16L. The drain of the transistor 11L, the collector of the transistor 12L, and the cathode of the diode 13L are all connected to the terminal 15L. The source of the transistor 11L, the emitter of the transistor 12L, and the anode of the diode 13L are all connected to the terminal 16L. The anode and the cathode of the parasitic diode 11Ld are connected to the source and the drain, respectively, of the transistor 11L.

The terminal 15H is connected to the power supply terminal TM12 to receive the power supply voltage VP. The terminal 16L is connected to the low-side terminal TM13. The terminals 16H and 15L are connected together inside the semiconductor device 1. The terminals 16H and 15L are connected to the output terminal TM11. Thus the switching elements 10H and 10L are connected in series with each other to constitute a half-bridge circuit.

Under the control of the high-side driver 20H, the switching element 10H switches between a conducting state and a non-conducting state the path between the terminals 15H and 16H. The state in which the terminals 15H and 16H conduct to each other is referred to as the on state of the switching element 10H, and the state in which the terminals 15H and 16H do not conduct to each other is referred to as the off state of the switching element 10H. When the transistors 11H and 12H are both in the on state, the switching element 10H is in the on state. Also when one of the transistors 11H and 12H is in the on state and the other is in the off state, the switching element 10H is in the on state. When the transistors 11H and 12H are both in the off state, the switching element 10H is in the off state.

Under the control of the low-side driver 20L, the switching element 10L switches between a conducting state and a non-conducting state the path between the terminals 15L and 16L. The state in which the terminals 15L and 16L conduct to each other is referred to as the on state of the switching element 10L, and the state in which the terminals 15L and 16L do not conduct to each other is referred to as the off state of the switching element 10L. When the transistors 11L and 12L are both in the on state, the switching element 10L is in the on state. Also when one of the transistors 11L and 12L is in the on state and the other is in the off state, the switching element 10L is in the on state. When the transistors 11L and 12L are both in the off state, the switching element 10L is in the off state.

The transistors 11H and 11L are formed using silicon carbide (SiC). However, any material (e.g., silicon) other than silicon carbide can be used to form the transistors 11H and 11L. The transistors 12H and 12L can be formed using silicon (Si). The diodes 13H and 13L are formed using silicon carbide (SiC). However, any material (e.g., silicon) other than silicon carbide can be used to form the diodes 13H and 13L.

In the following description, for any transistor or switching element, its being in the on or off state is occasionally expressed simply as its being on or off respectively. For any transistor or switching element, a switch from the off state to the on state is referred to as a turning-on, and a switch from the on state to the off state is referred to as a turning-off. A timing at which a turning-on occurs and a timing at which a turning-off occurs are referred to as a turn-on timing and a turn-off timing respectively. For any transistor or switching element, a period in which it is in the on state is often referred to as an on period, and a period in which it is in the off state is often referred to as an off period.

The high-side driver 20H is fed with the driving control signal HIN received at the control input terminal TM16. The high-side driver 20H is also connected to the ground, and is fed with a control supply voltage VCC, the output terminal voltage Vsw, and the boot voltage VB. The high-side driver 20H controls the gate potentials of the transistors 11H and 12H according to the driving control signal HIN, and thereby drives the switching element 10H (controls the state of the switching element 10H). The control supply voltage VCC is a positive direct-current voltage (e.g., 15 V) supplied from an external power supply (unillustrated) to the semiconductor device 1. The control supply voltage VCC may instead be generated within the semiconductor device 1.

The low-side driver 20L is fed with the driving control signal LIN received at the control input terminal TM17. The low-side driver 20L is also connected to the ground, and is fed with the control supply voltage VCC. The low-side driver 20L controls the gate potentials of the transistors 11L and 12L according to the driving control signal LIN, and thereby drives the switching element 10L (controls the state of the switching element 10L).

In the system SYS, the switching elements 10H and 10L are turned on alternately, and thus the switching elements 10H and 10L are not simultaneously on. The boot circuit 30 and the capacitor CB constitute a bootstrap circuit, which produces the boot voltage VB at the boot terminal TM15.

The boot circuit 30 includes a diode 31 that has an anode fed with the control supply voltage VCC and a cathode connected to the boot terminal TM15. In a period in which the switching element 10H is off and the switching element 10L is on, a charge current is supplied via the diode 31 to the capacitor CB; in no other period is the capacitor CB discharged via the diode 31. Thus, as the switching elements 10H and 10L are turned on alternately, the boot voltage VB has approximately a voltage value higher than the output terminal voltage Vsw by the control supply voltage VCC (here, the forward voltage of the diode 31 is ignored).

The gate voltage of the transistor 11H (i.e., the voltage applied to the gate of the transistor 11H) will be identified by the symbol "Vg_11H". The gate voltage of the transistor 12H (i.e., the voltage applied to the gate of the transistor 12H) will be identified by the symbol "Vg_12H". Between the high-side driver 20H and the switching element 10H, two separate wirings 43H and 44H are provided.

One terminal of the wiring 43H is connected to the high-side driver 20H, and the other terminal of the wiring 43H is connected to the gate of the transistor 11H. The high-side driver 20H feeds electric charge (positive electric charge) to, or draws electric charge (positive electric charge) from, the wiring 43H to control the gate voltage Vg_11H, and thereby controls the state (on or off) of the transistor 11H. The gate resistor 41H is inserted in the wiring 43H in series with it. The gate resistor 41H may be incorporated in the high-side driver 20H. The gate resistor 41H can be omitted. One terminal of the wiring 44H is connected to the high-side driver 20H, and the other terminal of the wiring 44H is connected to the gate of the transistor 12H. The high-side driver 20H feeds electric charge (positive electric charge) to, or draws electric charge (positive electric charge) from, the wiring 44H to control the gate voltage Vg_12H, and thereby controls the state (on or off) of the transistor 12H. The gate resistor 42H is inserted in the wiring 44H in series with it. The gate resistor 42H may be incorporated in the high-side driver 20H. The gate resistor 42H can be omitted.

The gate voltage of the transistor 11L (i.e., the voltage applied to the gate of the transistor 11L) will be identified by the symbol "Vg_11L". The gate voltage of the transistor 12L (i.e., the voltage applied to the gate of the transistor 12L) will be identified by the symbol "Vg_12L". Between the low-side driver 20L and the switching element 10L, two separate wirings 43L and 44L are provided.

One terminal of the wiring 43L is connected to the low-side driver 20L, and the other terminal of the wiring 43L is connected to the gate of the transistor 11L. The low-side driver 20L feeds electric charge (positive electric charge) to, or draws electric charge (positive electric charge) from, the wiring 43L to control the gate voltage Vg_11L, and thereby controls the state (on or off) of the transistor 11L. The gate resistor 41L is inserted in the wiring 43L in series with it. The gate resistor 41L may be incorporated in the low-side driver 20L. The gate resistor 41L can be omitted. One terminal of the wiring 44L is connected to the low-side driver 20L, and the other terminal of the wiring 44L is connected to the gate of the transistor 12L. The low-side driver 20L feeds electric charge (positive electric charge) to, or draws electric charge (positive electric charge) from, the wiring 44L to control the gate voltage Vg_12L, and thereby controls the state (on or off) of the transistor 12L. The gate resistor 42L is inserted in the wiring 44L in series with it. The gate resistor 42L may be incorporated in the low-side driver 20L. The gate resistor 42L can be omitted.

Figure 3:
FIG. 3 is a diagram showing a relationship among driving control signals, gate voltages, and the states of transistors in connection with a semiconductor device according to an embodiment of the present disclosure.

FIG. 3 shows the relationship among the driving control signals, the gate voltages, and the states of the transistors. The high-side driver 20H generates and controls the gate voltages Vg_11H and Vg_12H based on the voltage between the terminals TM11 and TM15, that is, based on the differential voltage (VB−Vsw). The high-side driver 20H can switch between high level and low level the gate voltages Vg_11H and Vg_12H individually according to the driving control signal HIN. The high level of the gate voltages Vg_11H and Vg_12H is equal to the level of the boot voltage VB, and the low level of the gate voltages Vg_11H and Vg_12H is equal to the level of the output terminal voltage Vsw.

The voltage (VB−Vsw) is the differential voltage between the terminals TM11 and TM15 relative to the potential at the terminal TM11, and corresponds to the level of the boot voltage VB relative to the output terminal voltage Vsw. The boot voltage VB is higher than the output terminal voltage Vsw and, in a steady state, the voltage (VB−Vsw) is stabilized at or around the control supply voltage VCC (i.e., the voltage (VB−Vsw) is stabilized at a value approximately equal to the value of the control supply voltage VCC). The magnitude of the control supply voltage VCC is greater than the magnitudes of the gate threshold voltages of the transistors 11H and 12H. Thus, in the high-level period of the gate voltage Vg_11H, the transistor 11H is on and, in the low-level period of the gate voltage Vg_11H, the transistor 11H is off. Likewise, in the high-level period of the gate voltage Vg_12H, the transistor 12H is on and, in the low-level period of the gate voltage Vg_12H, the transistor 12H is off.

On the other hand, the low-side driver 20L generates and controls the gate voltages Vg_11L and Vg_12L based on the control supply voltage VCC. The low-side driver 20L can switch between high level and low level the gate voltages Vg_11L and Vg_12L individually according to the driving control signal LIN. The high level of the gate voltages Vg_11L and Vg_12L is equal to the level of the control supply voltage VCC, and the low level of the gate voltages Vg_11L and Vg_12L is equal to the level of the ground (i.e., the ground potential).

The magnitude of the control supply voltage VCC is greater than the magnitudes of the gate threshold voltages of the transistors 11L and 12L. Thus, in the high-level period of the gate voltage Vg_11L, the transistor 11L is on and, in the low-level period of the gate voltage Vg_11L, the transistor 11L is off. Likewise, in the high-level period of the gate voltage Vg_12L, the transistor 12L is on and, in the low-level period of the gate voltage Vg_12L, the transistor 12L is off.

For any voltage of interest that takes high or low level (hereinafter the voltage of interest), when the voltage of interest is mentioned to have a particular level, it covers not only a situation where the voltage of interest has a level equal to the particular level but a situation where the voltage of interest has a level substantially equal to the particular level. Accordingly, for example, even when the gate voltage Vg_11H has a level practically equal to that of the boot voltage VB, the former can have a level that slightly differs from the level of the latter. The same applies also to any signal that takes high or low level.

Generally, MOSFETs are characterized by lower steady-state loss with respect to low current than IGBTs, and IGBTs are characterized by lower steady-state loss with respect to high current than MOSFETs. Accordingly, configuring a switching element with a parallel connection circuit of an MOSFET and an IGBT helps achieve low steady-state loss over a wide current range. In simple terms, the MOSFET and the IGBT can be turned on and off simultaneously in synchronization with a driving control signal (HIN or LIN). However, turning the MOSFET and the IGBT simultaneously is not always the optimal scheme to reduce switching loss.

In view of the above, when the low-side driver 20L turns on the switching element 10L in synchronization with an up edge in the driving control signal LIN, it can first turn on one of the transistors 11L and 12L and then turn on the other. Similarly, when the low-side driver 20L turns off the switching element 10L in synchronization with a down edge in the driving control signal LIN, it can first turn off one of the transistors 11L and 12L and then turn off the other. A similar description applies to the high-side driver 20H. While FIG. 3 shows an example where, when the switching element 10L is turned on, the transistor 11L is turned on first, instead the transistor 12L may be turned on first. While FIG. 3 shows an example where, when the switching element 10L is turned off, the transistor 11L is turned off first, instead the transistor 12L may be turned off first. A similar description applies to the high-side driver 20H.

Figure 4:
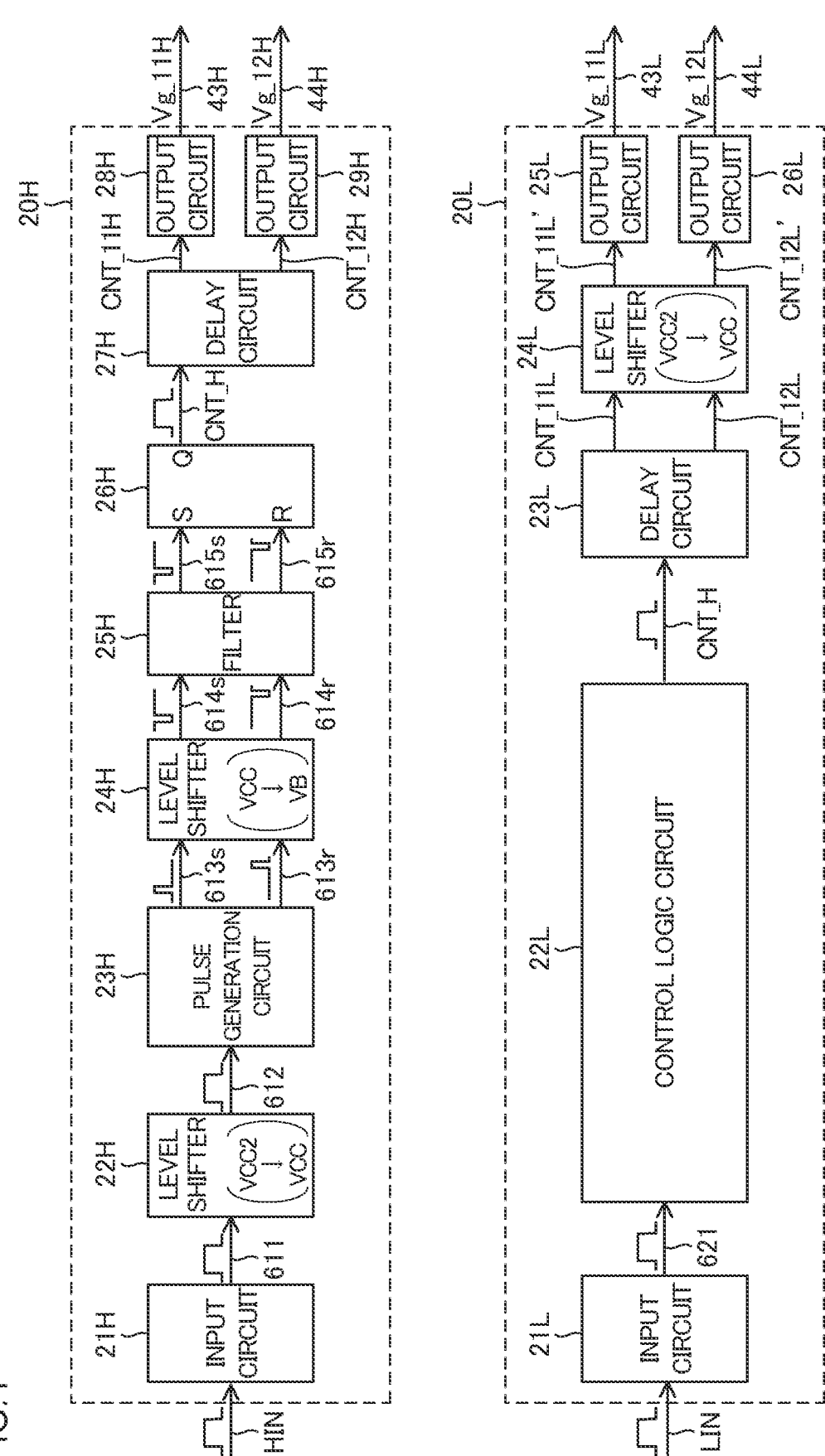
FIG. 4 is an internal block diagram of a high-side driver and a low-side driver in connection with an embodiment of the present disclosure.

FIG. 4 shows the internal configuration of the drivers 20H and 20L. The high-side driver 20H includes blocks identified by the symbols 21H to 29H. The low-side driver 20L includes blocks identified by the symbols 21L to 26L.

With reference to FIG. 4, the configuration of the high-side driver 20H will be described. An input circuit 21H operates based on the supply voltage VCC2 (e.g., 5 V) relative to the ground potential. The input circuit 21H is configured with a Schmitt buffer, and shapes the waveform of the driving control signal HIN to produce and output a binary signal 611. A level shifter 22H shifts the level of the binary signal 611 based on the supply voltage VCC2 (e.g., 5 V) and the control supply voltage VCC (e.g., 15 V) to generate a binary signal 612. Any binary signal takes as its signal level high or low level. The high level of the binary signal 611 is equal to the level of the supply voltage VCC2, and the high level of the binary signal 612 is equal to the level of the control supply voltage VCC. The low level of the binary signals 611 and 612 is equal to the level of the ground. In the semiconductor device 1, the control supply voltage VCC2 can be generated based on the control supply voltage VCC.

A pulse generation circuit 23H generates and outputs a set signal 613s and a reset signal 613r based on the binary signal 612. The signals 613s and 613r are in principle at low level. The pulse generation circuit 23H, at an up-edge timing of the binary signal 612, keeps the set signal 613s at high level for a predetermined very short period and, at a down-edge timing of the binary signal 612, keeps the reset signal 613r at high level for a predetermined very short period. The high level of the signals 613s and 613r is equal to the level of the control supply voltage VCC. The low level of the signals 613s and 613r is equal to the level of the ground.

Based on the control supply voltage VCC relative to the ground as well as the boot voltage VB relative to the output terminal voltage Vsw, a level shifter 24H shifts the level of the set signal 613s to generate a set signal 614s and shifts the level of the reset signal 613r to generate a reset signal 614r. The signals 614s and 614r are in principle at high level. The level shifter 24H, only in the high-level period of the set signal 613s, keeps the set signal 614s at low level and, only in the high-level period of the reset signal 613r, keeps the reset signal 614r at low level. The high level of the signals 614s and 614r is equal to the level of the boot voltage VB. The low level of the signals 614s and 614r is equal to the level of the output terminal voltage Vsw.

A filter 25H performs filtering to reduce noise in the set signal 614s and the reset signal 614r to output the filtered set signal 614s as a set signal 615s and the filtered reset signal 614r as a reset signal 615r. The filter 25H may employ a low-active circuit configuration or a high-active circuit configuration. In the configuration example in FIG. 4, it is assumed that, when the set signal 614s is at low level, the set signal 615s too is at low level and, when the set signal 614s is at high level, the set signal 615s too is at high level. Likewise, in the configuration example in FIG. 4, it is assumed that, when the reset signal 614r is at low level, the reset signal 615r too is at low level and, when the reset signal 614r is at high level, the reset signal 615r too is at high level.

A latch circuit 26H configured with an RS flip-flop is fed with the set signal 615s and the reset signal 615r. The latch circuit 26H outputs a control signal CNT_H based on the set signal 615s and the reset signal 615r. The control signal CNT_H is a type of binary signal. The latch circuit 26H can employ a low-active circuit configuration or a high-active circuit configuration. In the circuit configuration in FIG. 4, it is assumed that the latch circuit 26H, in synchronization with a down edge in the set signal 615s, generates an up edge in the control signal CNT_H and after that, in synchronization with a down edge in the reset signal 615r, generate a down edge in the control signal CNT_H. The latch circuit 26H operates using the boot voltage VB as a high-potential-side supply voltage and the output terminal voltage Vsw as a low-potential-side supply voltage. Accordingly, the high level of the control signal CNT_H is equal to the level of the boot voltage VB, and the low level of the control signal CNT_H is equal to the level of the output terminal voltage Vsw (see FIG. 5).

The control signal CNT_H corresponds to a signal resulting from shifting the level of the driving control signal HIN. On the assumption that no signal delay occurs in generating from the driving control signal HIN the control signal CNT_H, in the high-level period of the driving control signal HIN, the control signal CNT_H is at high level and, in the low-level period of the driving control signal HIN, the control signal CNT_H is at low level (see FIG. 5). Note that the latch circuit 26H includes a protection circuit (unillustrated): on detection of a predetermined fault (e.g., an undervoltage in the boot voltage VB), the latch circuit 26H fixes the control signal CNT_H at low level.

Like the latch circuit 26H, also a delay circuit 27H and output circuits 28H and 29H operate using the boot voltage VB as a high-potential-side supply voltage and the output terminal voltage Vsw as a low-potential-side supply voltage.

Figure 5:
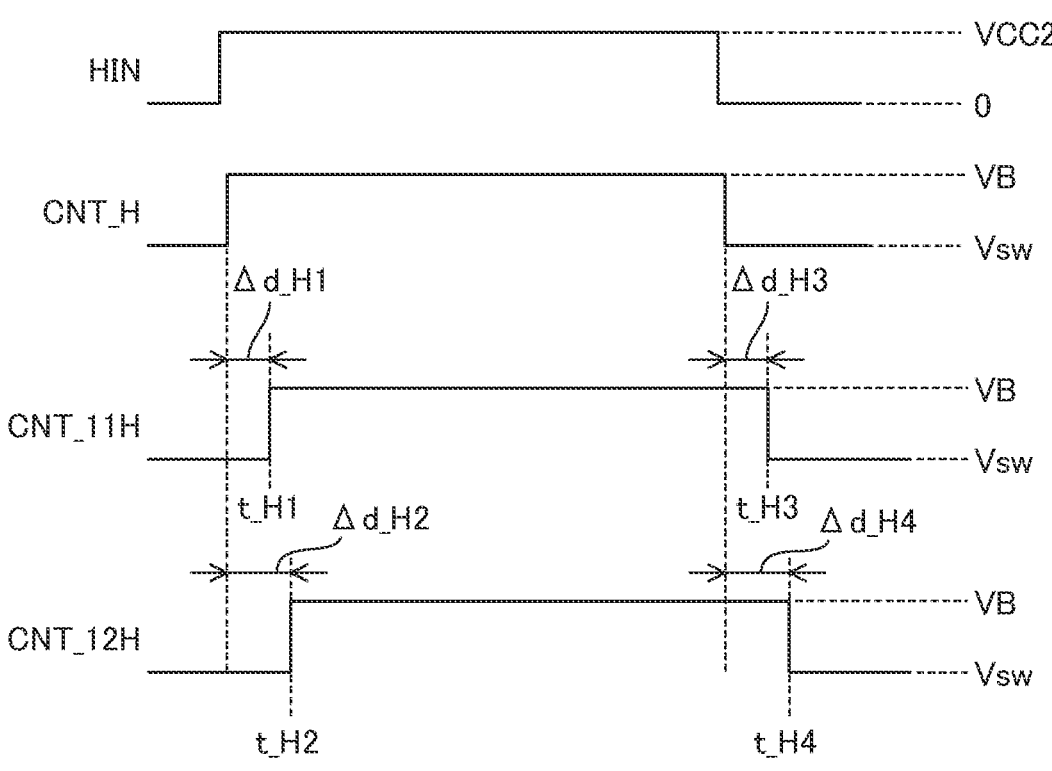
FIG. 5 is a diagram showing a relationship among a plurality of signals involved in the driving of a high-side switching element in connection with an embodiment of the present disclosure.

Based on the control signal CNT_H, the delay circuit 27H generates control signals CNT_11H and CNT_12H. FIG. 5 shows the relationship among the driving control signal HIN and the control signals CNT_H, CNT_11H, and CNT_12H. The control signals CNT_11H and CNT_12H too are each a type of binary signal. The high level of the control signals CNT_11H and CNT_12H is equal to the level of the boot voltage VB, and the low level of the control signals CNT_11H and CNT_12H is equal to the level of the output terminal voltage Vsw.

The delay circuit 27H, in response to an up edge in the control signal CNT_H, generates an up edge also in the control signals CNT_11H and CNT_12H. An up edge in the control signal CNT_11H indicates a turning-on of the transistor 11H, and an up edge in the control signal CNT_12H indicates a turning-on of the transistor 12H. An up-edge timing t_H1 of the control signal CNT_11H in response to an up edge in the control signal CNT_H is simultaneous with or later than the up-edge timing of the control signal CNT_H. The delay of the up-edge timing t_H1 of the control signal CNT_11H from the up-edge timing of the control signal CNT_H will be called the delay time Δd_H1. An up-edge timing t_H2 of the control signal CNT_12H in response to an up edge in the control signal CNT_H is simultaneous with or later than the up-edge timing of the control signal CNT_H. The delay of the up-edge timing t_H2 of the control signal CNT_12H from the up-edge timing of the control signal CNT_H will be called the delay time Δd_H2. Here, the delay times Δd_H1 and Δd_H2 can be different from each other: they can be such that Δd_H1>Δd_H2 or such that Δd_H1<Δd_H2; only one of the delay times Δd_H1 and Δd_H2 can be zero.

The difference dff_Hon between the delay times Δd_H1 and Δd_H2 is defined as follows: dff_Hon=Δd_H2−Δd_H1. The difference dff_Hon represents the time difference between the timing when a turning-on of the transistor 11H is indicated and the timing a turning-on of the transistor 12H is indicated, and is thus in the following description referred to also as the time difference dff_Hon. When dff_Hon<0, the transistor 12H turns on earlier than the transistor 11H by a time corresponding to the absolute value |dff_Hon|. When dff_Hon>0, the transistor 11H turns on earlier than the transistor 12H by a time corresponding to the absolute value |dff_Hon|.

The delay circuit 27H, in response to a down edge in the control signal CNT_H, generates a down edge also in the control signals CNT_11H and CNT_12H. A down edge in the control signal CNT_11H indicates a turning-off of the transistor 11H, and a down edge in the control signal CNT_12H indicates a turning-off of the transistor 12H. A down-edge timing t_H3 of the control signal CNT_11H in response to a down edge in the control signal CNT_H is simultaneous with or later than the down-edge timing of the control signal CNT_H. The delay of the down-edge timing t_H3 of the control signal CNT_11H from the down-edge timing of the control signal CNT_H will be called the delay time Δd_H3. A down-edge timing t_H4 of the control signal CNT_12H in response to a down edge in the control signal CNT_H is simultaneous with or later than the down-edge timing of the control signal CNT_H. The delay of the down-edge timing t_H4 of the control signal CNT_12H from the down-edge timing of the control signal CNT_H will be called the delay time Δd_H4. Here, the delay times Δd_H3 and Δd_H4 can be different from each other: they can be such that Δd_H3>Δd_H4 or such that Δd_H3<Δd_H4; only one of the delay times Δd_H3 and Δd_H4 can be zero.

The difference dff_Hoff between the delay times Δd_H3 and Δd_H4 is defined as follows: dff_Hoff=Δd_H4−Δd_H3. The difference dff_Hoff represents the time difference between the timing when a turning-off of the transistor 11H is indicated and the timing when a turning-off of the transistor 12H is indicated, and is thus in the following description referred to also as the time difference dff_Hoff. When dff_Hoff<0, the transistor 12H turns off earlier than the transistor 11H by a time corresponding to the absolute value |dff_Hoff|. When dff_Hoff>0, the transistor 11H turns off earlier than the transistor 12H by a time corresponding to the absolute value |dff_Hoff|.

The output circuit 28H is connected to the wiring 43H, which is connected to the gate of the transistor 11H (see also FIG. 1). The output circuit 28H controls the gate voltage Vg_11H based on the control signal CNT_11H. Specifically, in the high-level period of the control signal CNT_11H, the output circuit 28H keeps the gate voltage Vg_11H at the level of the boot voltage VB to keep the transistor 11H on; in the low-level period of the control signal CNT_11H, the output circuit 28H keeps the gate voltage Vg_11H at the level of the output terminal voltage Vsw to keep the transistor 11H off. Note however that, more specifically, the output circuit 28H, in response to an up edge in the control signal CNT_11H, starts to raise the gate voltage Vg_11H from the level of the output terminal voltage Vsw. Accordingly, a delay occurs after the up edge in the control signal CNT_11H until the transistor 11H actually turns on. Likewise, the output circuit 28H, in response to a down edge in the control signal CNT_11H, starts to drop the gate voltage Vg_11H from the level of the boot voltage VB. Accordingly, a delay occurs after the down edge in the control signal CNT_11H until the transistor 11H actually turns off.

The output circuit 29H is connected to the wiring 44H, which is connected to the gate of the transistor 12H (see also FIG. 1). The output circuit 29H controls the gate voltage Vg_12H based on the control signal CNT_12H. Specifically, in the high-level period of the control signal CNT_12H, the output circuit 29H keeps the gate voltage Vg_12H at the level of the boot voltage VB to keep the transistor 12H on; in the low-level period of the control signal CNT_12H, the output circuit 29H keeps the gate voltage Vg_12H at the level of the output terminal voltage Vsw to keep the transistor 12H off. Note however that, more specifically, the output circuit 29H, in response to an up edge in the control signal CNT_12H, starts to raise the gate voltage Vg_12H from the level of the output terminal voltage Vsw. Accordingly, a delay occurs after the up edge in the control signal CNT_12H until the transistor 12H actually turns on. Likewise, the output circuit 29H, in response to a down edge in the control signal CNT_12H, starts to drop the gate voltage Vg_12H from the level of the boot voltage VB. Accordingly, a delay occurs after the down edge in the control signal CNT_12H until the transistor 12H actually turns off.

Now, with reference to FIG. 4, the configuration of the low-side driver 20L will be described. An input circuit 21L, a control logic circuit 22L, and a delay circuit 23L operate based on the supply voltage VCC2 relative to the ground potential. The input circuit 21L is configured with a Schmitt buffer, and shapes the waveform of the driving control signal LIN to produce and output a binary signal 621. Based on the binary signal 621, the control logic circuit 22L generates a control signal CNT_L. The control signal CNT_L is a type of binary signal. The driving control signal LIN, the binary signal 621, and the control signal CNT_L can be understood to be substantially identical rectangular-wave signals. That is, on the assumption that no signal delay occurs in generating from the driving control signal LIN the control signal CNT_L, in the high-level period of the driving control signal LIN, the control signal CNT_L is at high level and, in the low-level period of the driving control signal LIN, the control signal CNT_L is at low level (see FIG. 6). Note that the control logic circuit 22L includes a protection circuit (unillustrated): if the protection circuit detects a fault (e.g., an abnormal temperature fault or an overcurrent fault), the control signal CNT_L is held at low level.

Figure 6:
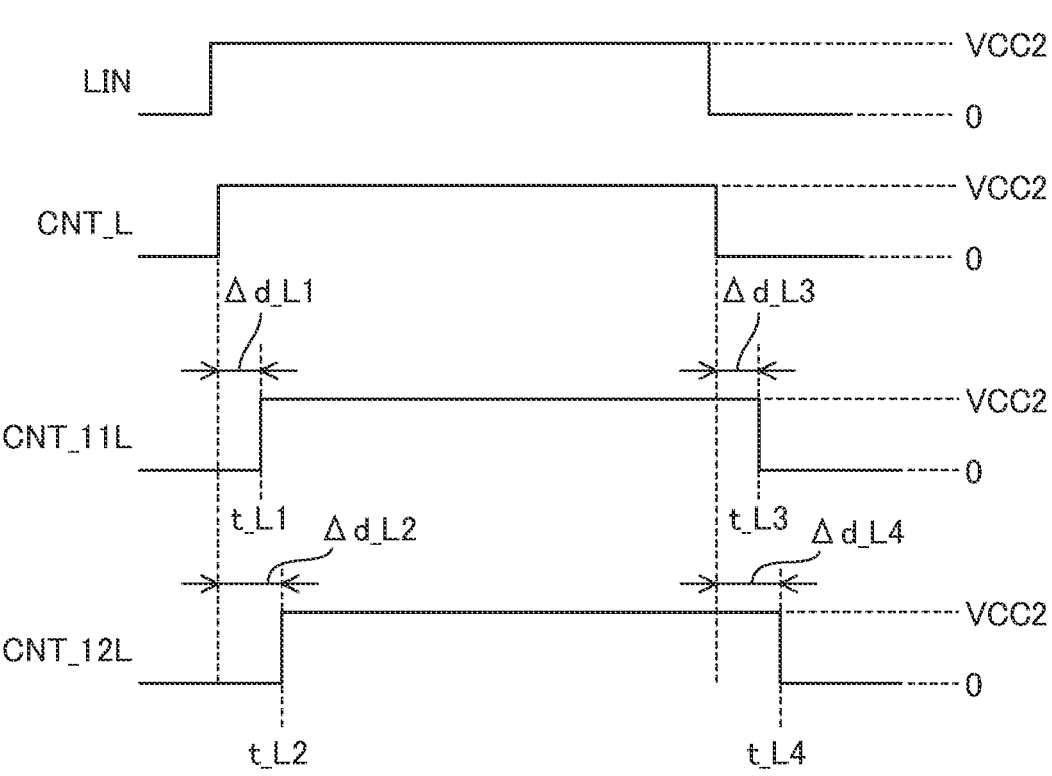
FIG. 6 is a diagram showing a relationship among a plurality of signals involved in the driving of a low-side switching element in connection with an embodiment of the present disclosure.

Based on the control signal CNT_L, the delay circuit 23L generates control signals CNT_11L and CNT_12L. FIG. 6 shows the relationship among the driving control signal LIN and the control signals CNT_L, CNT_11L, and CNT_12L. The control signals CNT_11L and CNT_12L too are each a type of binary signal. As with the driving control signal LTN, the high level of the control signals CNT_L. CNT_11L, and CNT_12L is equal to the level of the supply voltage VCC2, and the low level of the control signals CNT_L, CNT_11L, and CNT_12L is equal to the level of the ground.

The delay circuit 23L, in response to an up edge in the control signal CNT_L, generates an up edge also in the control signals CNT_11L and CNT_12L. An up edge in the control signal CNT_11L indicates a turning-on of the transistor 11L, and an up edge in the control signal CNT_12L indicates a turning-on of the transistor 12L. An up-edge timing t_L1 of the control signal CNT_11L in response to an up edge in the control signal CNT_L is simultaneous with or later than the up-edge timing of the control signal CNT_L. The delay of the up-edge timing t_L1 of the control signal CNT_11L from the up-edge timing of the control signal CNT_L will be called the delay time Δd_L1. An up-edge timing t_L2 of the control signal CNT_12L in response to an up edge in the control signal CNT_L is simultaneous with or later than the up-edge timing of the control signal CNT_L. The delay of the up-edge timing t_L2 of the control signal CNT_12L from the up-edge timing of the control signal CNT_L will be called the delay time Δd_L2. Here, the delay times Δd_L1 and Δd_L2 can be different from each other: they can be such that Δd_L1>Δd_L2 or such that Δd_L1<Δd_L2; only one of the delay time Δd_L1 and Δd_L2 can be zero.

The difference dff_Lon between the delay times Δd_L1 and Δd_L2 is defined as follows: dff_Lon=Δd_L2−Δd_L1. The difference dff_Lon represents the time difference between the timing when a turning-on of the transistor 11L is indicated and the timing when a turning-on of the transistor 12L is indicated, and is thus in the following description referred to also as the time difference dff_Lon. When dff_Lon<0, the transistor 12L turns on earlier than the transistor 11L by a time corresponding to the absolute value |dff_Lon|. When dff_Lon>0, the transistor 11L turns on earlier than the transistor 12L by a time corresponding to the absolute value |dff_Lon|.

The delay circuit 23L, in response to a down edge in the control signal CNT_L, generates a down edge also in the control signals CNT_11L and CNT_12L. A down edge in the control signal CNT_11L indicates a turning-off of the transistor 11L, and a down edge in the control signal CNT_12L indicates a turning-off of the transistor 12L. A down-edge timing t_L3 of the control signal CNT_11L in response to a down edge in the control signal CNT_L is simultaneous with or later than the down-edge timing of the control signal CNT_L. The delay of the down-edge timing t_L3 of the control signal CNT_11L from the down-edge timing of the control signal CNT_L will be called the delay time Δd_L3. A down-edge timing t_L4 of the control signal CNT_12L in response to a down edge in the control signal CNT_L is simultaneous with or later than the down-edge timing of the control signal CNT_L. The delay of the down-edge timing t_L4 of the control signal CNT_12L from the down-edge timing of the control signal CNT_L will be called the delay time Δd_L4. Here, the delay times Δd_L3 and Δd_L4 can be different from each other: they can be such that Δd_L3>Δd_L4 or such that Δd_L3<Δd_L4; only one of the delay times Δd_L3 and Δd_L4 can be zero.

The difference dff_Loff between the delay times Δd_L3 and Δd_L4 is defined as follows: dff_Loff=Δd_L4−Δd_L3. The difference dff_Loff represents the time difference between the timing when a turning-off of the transistor 11L is indicated and the timing when a turning-off of the transistor 12L is indicated, and is thus in the following description referred to also as the time difference dff_Loff. When dff_Loff<0, the transistor 12L turns off earlier than the transistor 11L by a time corresponding to the absolute value |dff_Loff|. When dff_Loff>0, the transistor 11L turns off earlier than the transistor 12L by a time corresponding to the absolute value |dff_Loff|.

Based on the supply voltage VCC2 (e.g., 5 V) and the control supply voltage VCC (e.g., 15 V), a level shifter 24L shifts the levels of the control signals CNT_11L and CNT_12L to generate control signals CNT_11L' and CNT_12L'. Through the level shifting by the level shifter 24L, the high level of the control signals CNT_11L and CNT_12L is shifted to the level of the control supply voltage VCC. The control signals CNT_11L and CNT_12L having undergone the level shifting are the control signals CNT_11L' and CNT_12L' respectively.

The output circuit 25L is connected to the wiring 43L, which is connected to the gate of the transistor 11L (see also FIG. 1). The output circuit 25L controls the gate voltage Vg_11L based on the control signal CNT_11L'. Specifically, in the high-level period of the control signal CNT_11L', the output circuit 25L keeps the gate voltage Vg_11L at the level of the control supply voltage VCC to keep the transistor 11L on; in the low-level period of the control signal CNT_11L', the output circuit 25L keeps the gate voltage Vg_11L at the level of the ground to keep the transistor 11L off. Note however that, more specifically, the output circuit 25L, in response to an up edge in the control signal CNT_11L', makes the gate voltage Vg_11L start to rise from the level of the ground. Accordingly, a delay occurs after the up edge in the control signal CNT_11L' until the transistor 11L actually turns on. Likewise, the output circuit 25L, in response to a down edge in the control signal CNT_11L', makes the gate voltage Vg_11L start to fall from the level of the control supply voltage VCC. Accordingly, a delay occurs after the down edge in the control signal CNT_11L' until the transistor 11L actually turns off.

The output circuit 26L is connected to the wiring 44L, which is connected to the gate of the transistor 12L (see also FIG. 1). The output circuit 26L controls the gate voltage Vg_12L based on the control signal CNT_12L'. Specifically, in the high-level period of the control signal CNT_12L', the output circuit 26L keeps the gate voltage Vg_12L at the level of the control supply voltage VCC to keep the transistor 12L on; in the low-level period of the control signal CNT_12L', the output circuit 26L keeps the gate voltage Vg_12L at the level of the ground to keep the transistor 12L off. Note however that, more specifically, the output circuit 26L, in response to an up edge in the control signal CNT_12L', makes the gate voltage Vg_12L start to rise from the level of the ground. Accordingly, a delay occurs after the up edge in the control signal CNT_12L' until the transistor 12L actually turns on. Likewise, the output circuit 26L, in response to a down edge in the control signal CNT_12L', makes the gate voltage Vg_12L start to fall from the level of the control supply voltage VCC. Accordingly, a delay occurs after the down edge in the control signal CNT_12L' until the transistor 12L actually turns off.

Figure 7:
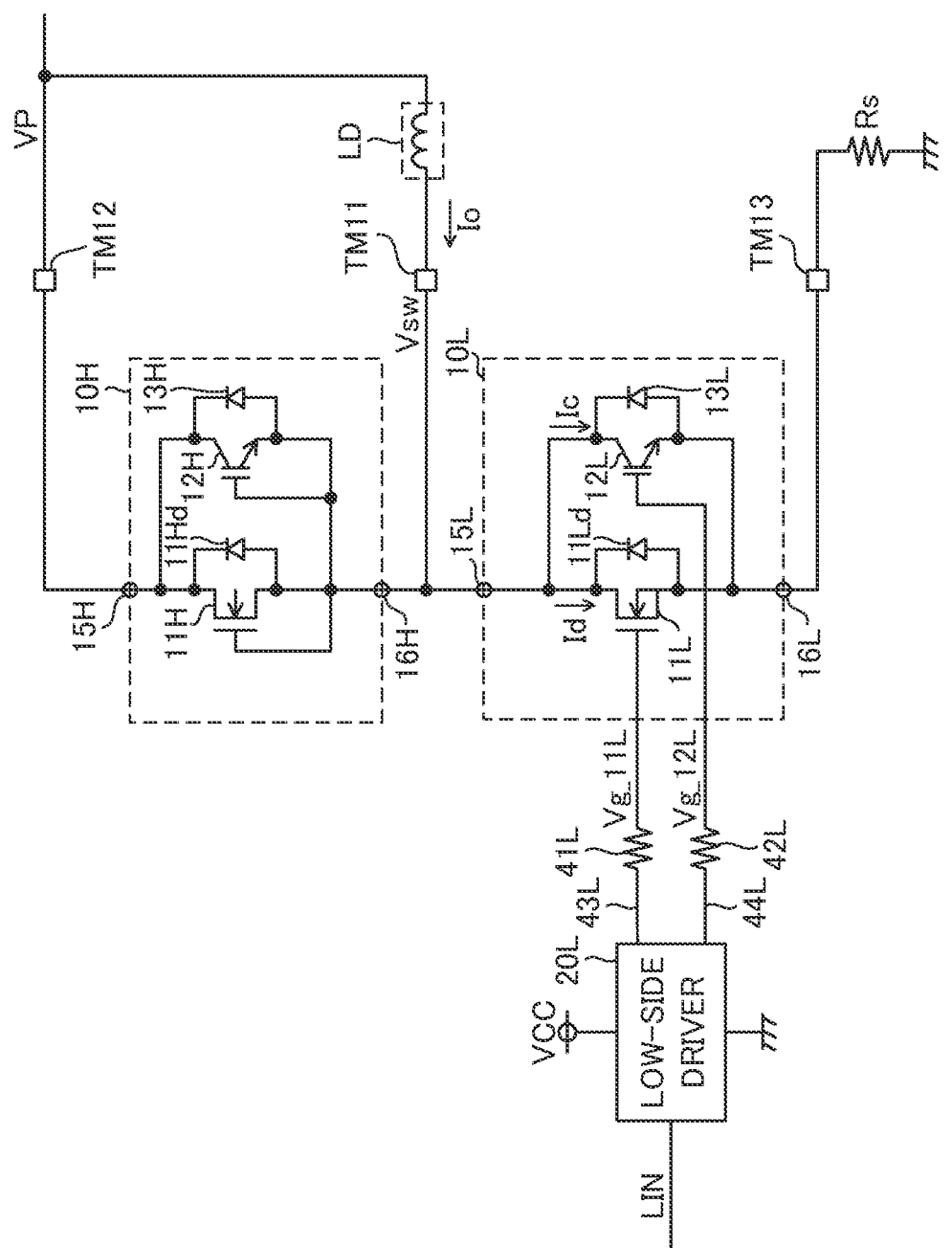
FIG. 7 is a configuration diagram of an evaluation system in connection with an embodiment of the present disclosure.

To study a delay time (delay times in delay circuits) adequate for reduction of switching loss, an evaluation system as shown in FIG. 7 was built. The evaluation system in FIG. 7, as compared with the system SYS in FIG. 1, the gate and the source of the transistor 11H are short-circuited together, and the gate and the emitter of the transistor 12H are short-circuited together. On the evaluation system in FIG. 7, evaluation tests were conducted. In the evaluation tests, the driving control signal LIN was switched between high and low levels alternately such that a substantially constant load current Io keeps passing in the direction from a wiring fed with the power supply voltage VP across the load LD to the output terminal TM11. Measured in the evaluation tests were the voltages Vg_11L, Vg_12L, and Vsw along with the drain current Id of the transistor 11L and the collector current Ic of the transistor 12L. The sum of the drain current Id of the transistor 11L and the collector current Ic of the transistor 12L will be referred to as the sum current Imath.

[Turn-On Evaluation Tests]

As evaluation tests, turn-on evaluation tests were conducted as described below. In the turn-on evaluation tests, while the time difference dff_Lon (see FIG. 6) mentioned above was varied in different ways, the waveforms of the relevant voltages and currents were measured.

Figure 8:
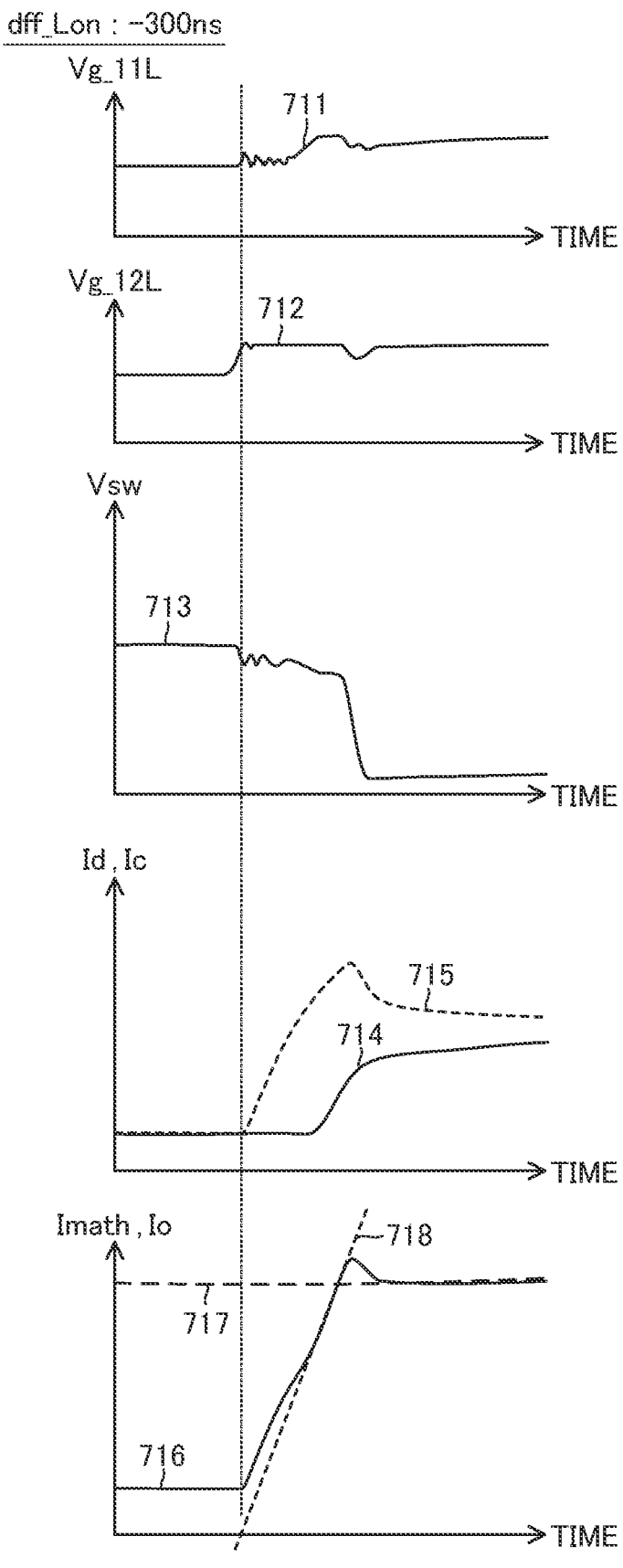
FIG. 8 is a diagram schematically showing the waveforms of voltages and currents observed in a first turn-on evaluation test in connection with an embodiment of the present disclosure.
Figure 9:
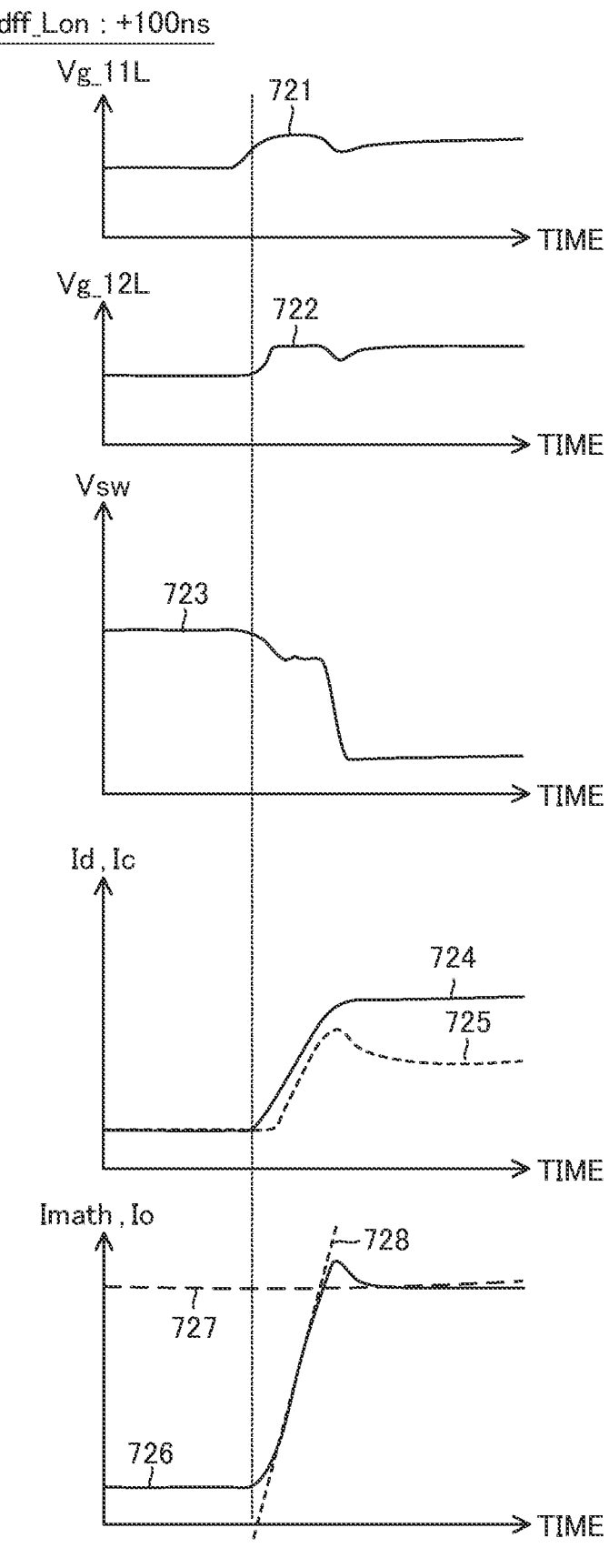
FIG. 9 is a diagram schematically showing the waveforms of voltages and currents observed in a second turn-on evaluation test in connection with an embodiment of the present disclosure.
Figure 10:
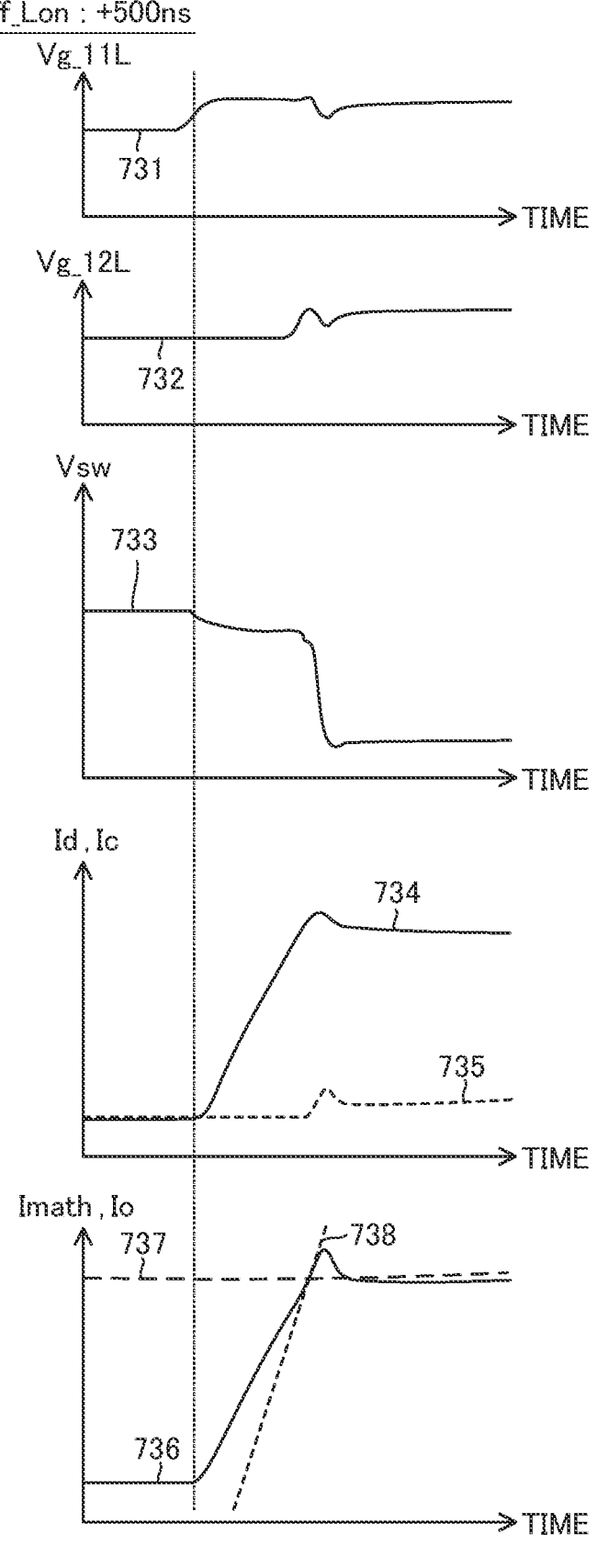
FIG. 10 is a diagram schematically showing the waveforms of voltages and currents observed in a third turn-on evaluation test in connection with an embodiment of the present disclosure.

FIGS. 8, 9, and 10 schematically show the waveforms of the relevant voltages and currents observed in a first, a second, and a third turn-on evaluation test respectively. In the first turn-on evaluation test corresponding to FIG. 8, the time difference dff_Lon mentioned above was set to −300 ns. This equivalently corresponds to turning on the transistor 12L earlier than the transistor 11L by 300 ns. In the second turn-on evaluation test corresponding to FIG. 9, the time difference dff_Lon mentioned above was set to +100 ns. This equivalently corresponds to turning on the transistor 11L earlier than the transistor 12L by 100 ns. In the third turn-on evaluation test corresponding to FIG. 10, the time difference dff_Lon mentioned above was set to +500 ns. This equivalently corresponds to turning on the transistor 11L earlier than the transistor 12L by 500 ns. Here, "ns" is an abbreviation of nanoseconds.

FIG. 8 schematically shows, as waveforms 711, 712, 713, 714, 715, 716, and 717 respectively, the waveforms of the gate voltage Vg_11L, the gate voltage Vg_12L, the output terminal voltage Vsw, the drain current Id, the collector current Ic, the sum current Imath, and the load current Io as observed in the first turn-on evaluation test. FIG. 9 schematically shows, as waveforms 721, 722, 723, 724, 725, 726, and 727 respectively, the waveforms of the gate voltage Vg_11L, the gate voltage Vg_12L, the output terminal voltage Vsw, the drain current Id, the collector current Ic, the sum current Imath, and the load current Io as observed in the second turn-on evaluation test. FIG. 10 schematically shows, as waveforms 731, 732, 733, 734, 735, 736, and 737 respectively, the waveforms of the gate voltage Vg_11L, the gate voltage Vg_12L, the output terminal voltage Vsw, the drain current Id, the collector current Ic, the sum current Imath, and the load current Io as observed in the third turn-on evaluation test. The minute variations in the voltage waveforms in FIGS. 8 to 10 are ascribable to the currents passing across the circuit board used in evaluation and the inductance components in the patterns on the circuit board (this applies also to FIGS. 13 to 16 referred to later). FIGS. 8 to 10 show the observed waveforms only schematically and do not show the noise components present in the observed waveforms (this applies also to FIGS. 13 to 16 referred to later).

A broken straight line 718 in FIG. 8, a broken straight line 728 in FIG. 9, and a broken straight line 738 in FIG. 10 indicate the gradient of the sum current Imath at a timing at which the rate of increase of the sum current Imath is highest in the first, second, and third turn-on evaluation tests respectively.

The first and third turn-on evaluation tests reveal that, in the process of the sum current Imath increasing as a result of the switching element 10L turning on, the rate of increase of the sum current Imath changes sharply. The reasons are as follows. In the first turn-on evaluation test, first the transistor 12L turns on so that only the increase of the collector current Ic contributes to the increase of the sum current Imath, and later the transistor 11L turns on to increase the rate of increase of the sum current Imath. In the third turn-on evaluation test, first the transistor 11L turns on so that only the increase of the drain current Id contributes to the increase of the sum current Imath, and later the transistor 12L turns on to increase the rate of increase of the sum current Imath.

By contrast, the second turn-on evaluation test reveals that, in the process of the sum current Imath increasing as a result of the switching element 10L turning on, the rate of increase of the sum current Imath remains substantially constant. This means that, in the process of the sum current Imath increasing, the drain current Id and the collector current Ic increase concurrently at substantially even rates.

Figure 11:
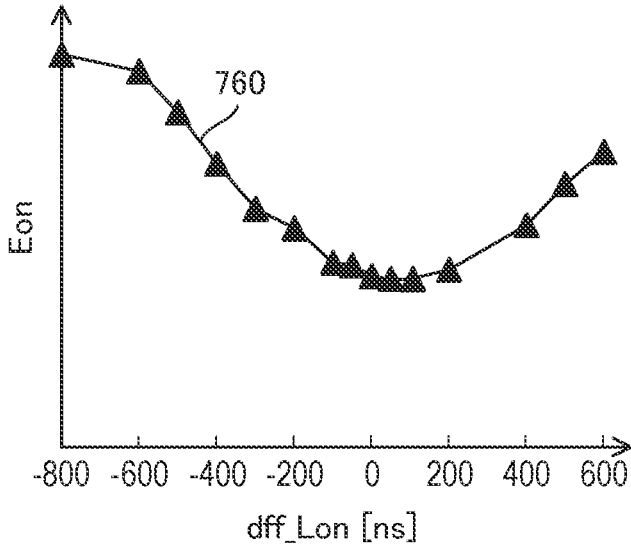
FIG. 11 is a diagram showing a relationship between turn-on loss and turn-on time difference between two transistors in connection with an embodiment of the present disclosure.

Under conditions where, in the process of the sum current Imath increasing as a result of the switching element 10L turning on, the rate of increase of the sum current Imath remains substantially constant, the turn-on loss Eon is minimized. In FIG. 11, waveform 760 represents the relationship between the turn-on loss Eon and the time difference dff_Lon in the turn-on evaluation tests. The turn-on loss Eon is the switching loss that occurs in the switching element 10L at its turning-on. That is, the turn-on loss Eon is the switching loss that occurs in the switching element 10L during its transition from the off state to the on state. The turn-on loss Eon corresponds to the sum of the turn-on loss in the transistor 11L and the turn-on loss in the transistor 12L. The turn-on loss in the transistor 11L is the switching loss that occurs in the transistor 11L during its transition from the off state to the on state. The turn-on loss in the transistor 12L is the switching loss that occurs in the transistor 12L during its transition from the off state to the on state.

Figure 12:
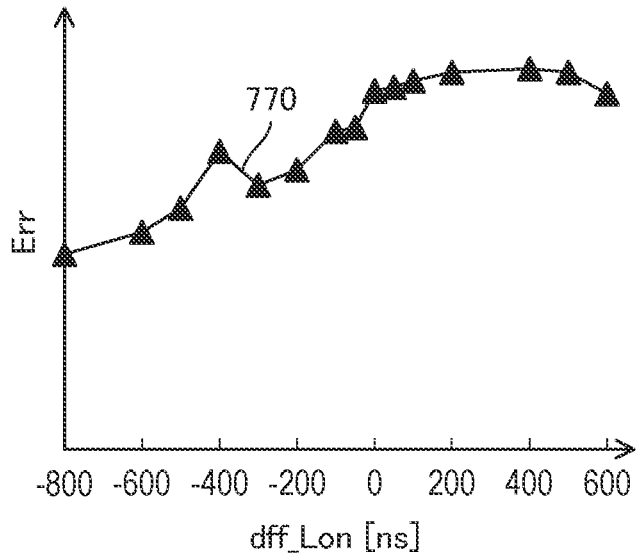
FIG. 12 is a diagram showing a relationship between recovery loss and turn-on time difference between two transistors in connection with an embodiment of the present disclosure.

In FIG. 12, waveform 770 represents the relationship between the recovery loss Err and the time difference dff_Lon in the turn-on evaluation tests. The recovery loss Err is the recovery loss that occurs in the diodes 11Hd and 13H in the high-side switching element 10H when the low-side switching element 10L turns on (this recovery loss occurs mainly in the diode 13H). While FIGS. 11 and 12 do not show any specific values of the turn-on loss Eon and the recovery loss Err, the recovery loss Err is sufficiently low compared with (e.g., one-tenth to one-several-tenth of) the turn-on loss Eon. Accordingly, in discussing the total switching loss in the switching elements 10H and 10L, attention can be paid solely to the turn-on loss Eon.

It has been found out that, with the combination of the transistors 11L and 12L used in the turn-on evaluation tests of the embodiment, setting the time difference dff_Lon to around +100 minimizes the turn-on loss Eon. In turning on the switching element 10L, a significantly large absolute value |dff_Lon| causes a current to pass in only one of the transistors 11L and 12L for a long period, and this leads to an increased turn-on loss Eon. With the time difference dff_Lon around zero, the switching element 10L turns on with approximately even currents distributed between the transistors 11L and 12L, and this is expected to reduce the turn-on loss Eon. In reality, however, depending on, among others, the combination of the characteristics of the transistors 11L and 12L, the time difference dff_Lon adequate to minimize the turn-on loss Eon varies.

The semiconductor device 1 includes the delay circuit 23L, which permits a desired time difference dff_Lon to be secured between the turn-on timings of the transistors 11L and 12L. In practice, at the stage of designing, manufacturing, or shipping of the semiconductor device 1, a time difference dff_Lon that minimizes the turn-on loss Eon can be determined through tests or the like and the so determined time difference dff_Lon can be used in the delay circuit 23L.

In that case, the delay circuit 23L can set the time difference dff_Lon so as to reduce the switching loss in the switching element 10L at its turning-on as compared with when the time difference dff_Lon is zero (i.e., as compared with when the timings t_L1 and t_L2 shown in FIG. 6 are simultaneous).

To achieve that, in a case where, as a result of the transistors 11L and 12L turning on, the drain current Id of the transistor 11L and the collector current Ic of the transistor 11L increase, when the transistors 11L and 12L are turned on in response to a first predetermined change (here, an up edge) in the driving control signal LIN, the delay circuit 23L can set the time difference dff_Lon such that the timing at which the rate of increase of the drain current Id of the transistor 11L becomes highest and the timing at which the rate of increase of the collector current Ic of the transistor 12L becomes highest are simultaneous.

In the turn-on evaluation tests, with attention paid to the low-side switching element 10L, the turn-on loss is evaluated; based on the evaluation results, the delay circuit 23L is configured as described above. The high-side delay circuit 27H can be designed similarly.

Specifically, the delay circuit 27H can set the time difference dff_Hon so as to reduce the switching loss in the switching element 10H at its turning-on (in the following description referred to as the turn-on loss Eon') as compared with when the time difference dff_Hon is zero (i.e., as compared with when the timings t_H1 and t_H2 shown in FIG. 5 are simultaneous).

To achieve that, in a case where, as a result of the transistors 11H and 12H turning on, the drain current of the transistor 11H and the collector current of the transistor 12H increase, when the transistors 11H and 12H are turned on in response to a first predetermined change (here, an up edge) in the driving control signal HIN, the delay circuit 27H can provide a time difference dff_Hon such that the timing at which the rate of increase of the drain current of the transistor 11H becomes highest and the timing at which the rate of increase of the collector current of the transistor 12H becomes highest are simultaneous.

The turn-on loss Eon' is the loss that occurs in the switching element 10H during its transition from the on state to the off state. The turn-on loss Eon' corresponds to the sum of the turn-on loss in the transistor 11H and the turn-on loss in the transistor 12H. The turn-on loss in the transistor 11H is the switching loss that occurs in the transistor 11H during its transition from the off state to the on state. The turn-on loss in the transistor 12H is the switching loss that occurs in the transistor 12H during its transition from the off state to the on state.

[Turn-Off Evaluation Tests]

As evaluation tests, turn-off evaluation tests were conducted as described below. In the turn-off evaluation tests, while the time difference dff_Loff (see FIG. 6) mentioned above was varied in different ways, the waveforms of the relevant voltages and currents were measured.

FIGS. 13, 14, 15, and 16 schematically show the waveforms of the relevant voltages and currents observed in a first, a second, a third, and a fourth turn-off evaluation test respectively. In the first turn-off evaluation test corresponding to FIG. 13, the time difference dff_Loff mentioned above was set to −200 ns. This equivalently corresponds to turning off the transistor 12L earlier than the transistor 11L by 200 ns. In the second turn-off evaluation test corresponding to FIG. 14, the time difference dff_Loff mentioned above was set to 0 ns. This equivalently corresponds to turning off the transistors 11L and 12L simultaneously. In the third turn-off evaluation test corresponding to FIG. 15, the time difference dff_Loff mentioned above was set to +300 ns. This equivalently corresponds to turning off the transistor 11L earlier than the transistor 12L by 300 ns. In the fourth turn-off evaluation test corresponding to FIG. 16, the time difference dff_Loff mentioned above was set to +600 ns. This equivalently corresponds to turning off the transistor 11L earlier than the transistor 12L by 600 ns.

Figure 13:
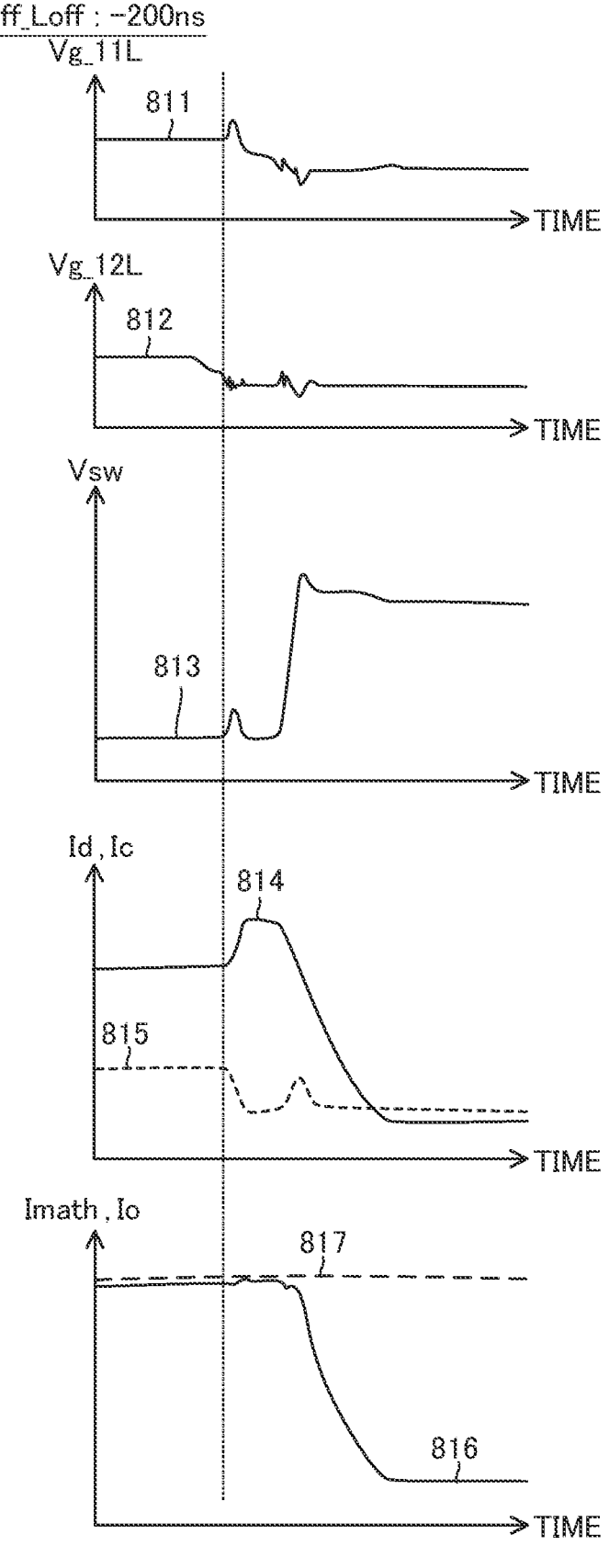
FIG. 13 is a diagram schematically showing the waveforms of voltages and currents observed in a first turn-off evaluation test in connection with an embodiment of the present disclosure.
Figure 14:
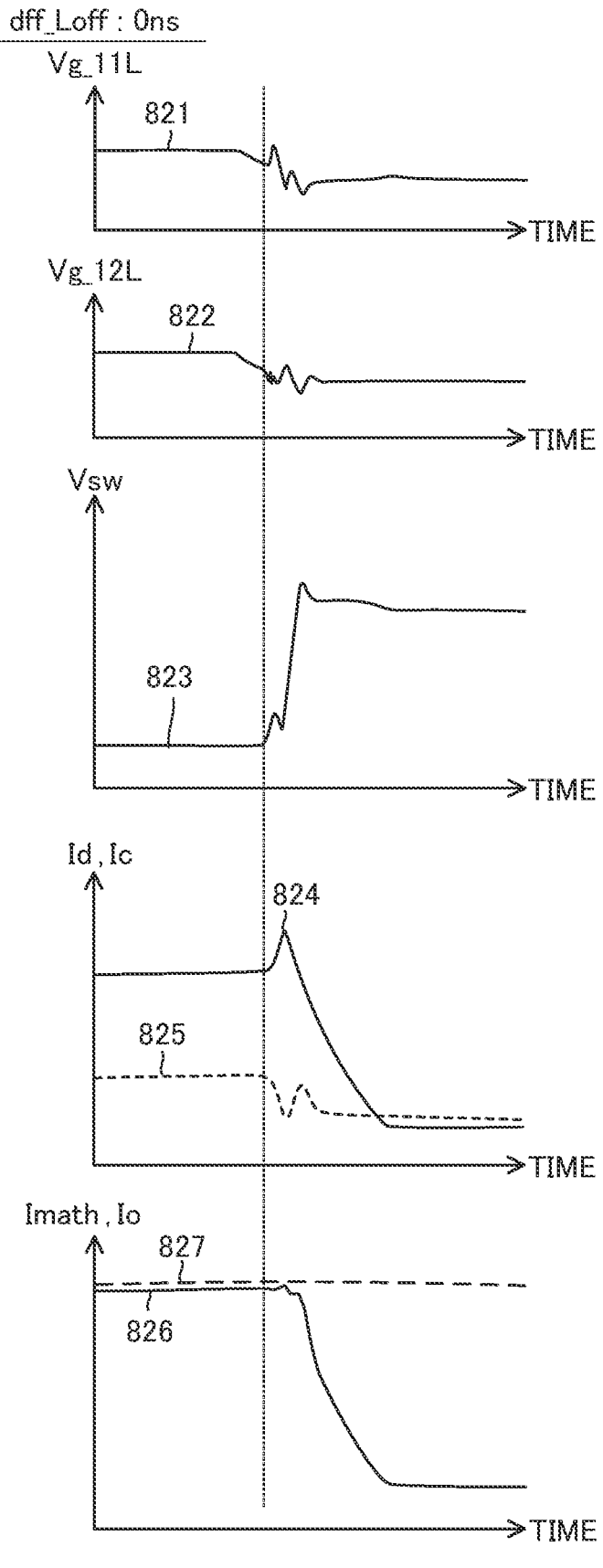
FIG. 14 is a diagram schematically showing the waveforms of voltages and currents observed in a second turn-off evaluation test in connection with an embodiment of the present disclosure.
Figure 15:
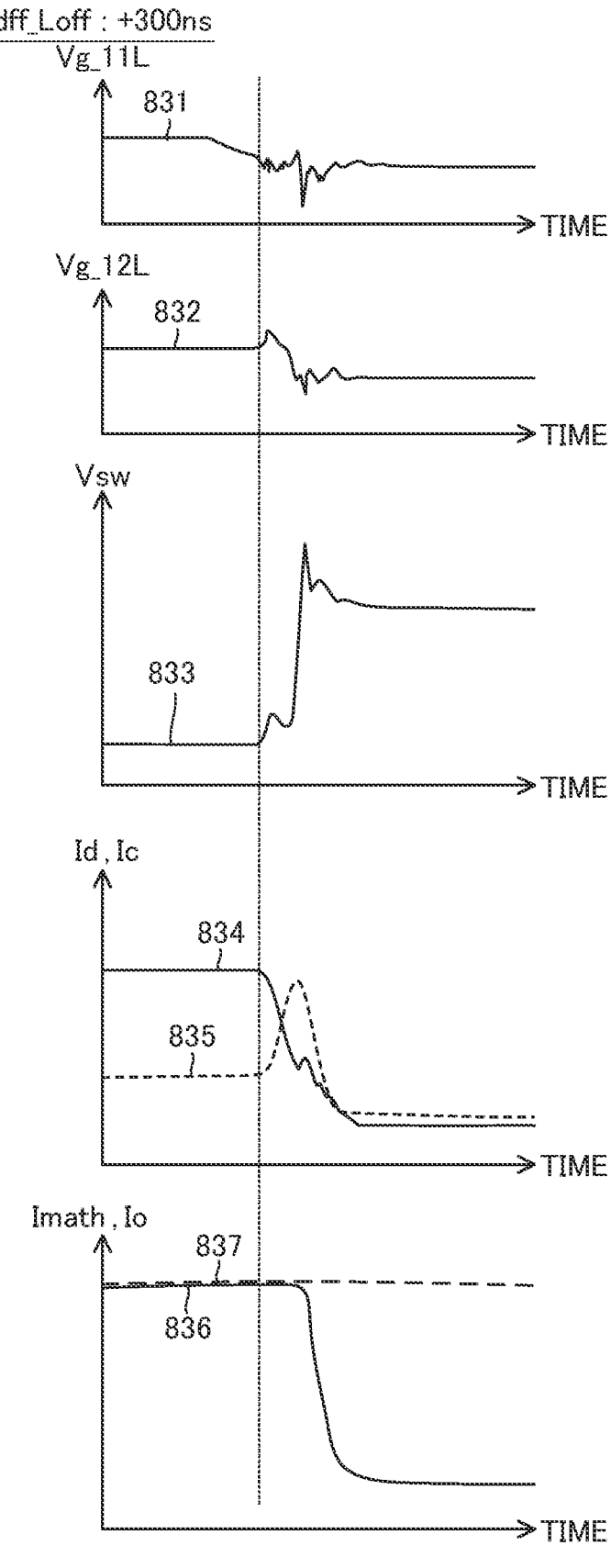
FIG. 15 is a diagram schematically showing the waveforms of voltages and currents observed in a third turn-off evaluation test in connection with an embodiment of the present disclosure.
Figure 16:
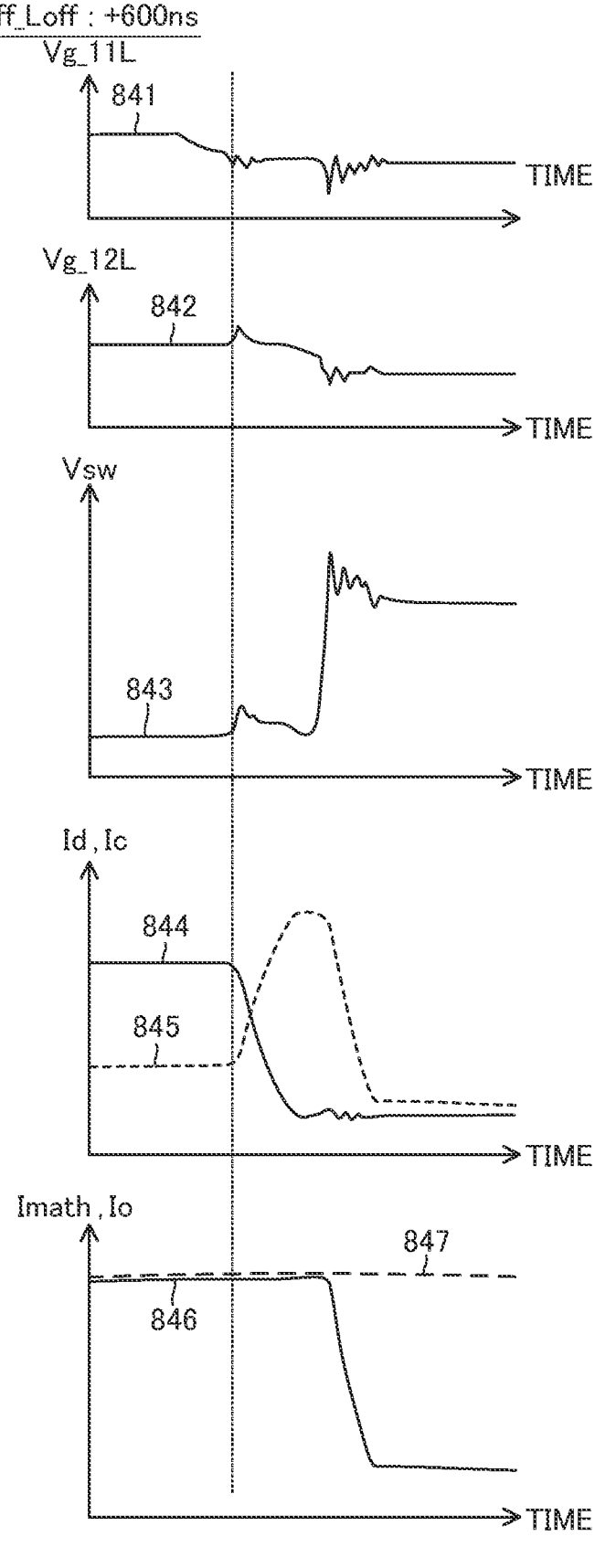
FIG. 16 is a diagram schematically showing the waveforms of voltages and currents observed in a fourth turn-off evaluation test in connection with an embodiment of the present disclosure.

FIG. 13 schematically shows, as waveforms 811, 812, 813, 814, 815, 816, and 817 respectively, the waveforms of the gate voltage Vg_11L, the gate voltage Vg_12L, the output terminal voltage Vsw, the drain current Id, the collector current Ic, the sum current Imath, and the load current Io as observed in the first turn-off evaluation test. FIG. 14 schematically shows, as waveforms 821, 822, 823, 824, 825, 826, and 827 respectively, the waveforms of the gate voltage Vg_11L, the gate voltage Vg_12L, the output terminal voltage Vsw, the drain current Id, the collector current Ic, the sum current Imath, and the load current Io as observed in the second turn-off evaluation test. FIG. 15 schematically shows, as waveforms 831, 832, 833, 834, 835, 836, and 837 respectively, the waveforms of the gate voltage Vg_11L, the gate voltage Vg_12L, the output terminal voltage Vsw, the drain current Id, the collector current Ic, the sum current Imath, and the load current Io as observed in the third turn-off evaluation test. FIG. 16 schematically shows, as waveforms 841, 842, 843, 844, 845, 846, and 847 respectively, the waveforms of the gate voltage Vg_11L, the gate voltage Vg_12L, the output terminal voltage Vsw, the drain current Id, the collector current Ic, the sum current Imath, and the load current Io as observed in the fourth turn-off evaluation test.

When the switching element 10L is turned off, in the process of the transition of the transistor 11L or 12L from the on state to the off state, the output terminal voltage Vsw first rises from around 0 V, then falls, and then rises sharply (see waveforms 813, 823, 833, and 843). The first rise of the output terminal voltage Vsw occurs in the process of the transistor 11L or transistor 12L turning off. The second rise of the output terminal voltage Vsw occurs in the process of, after one of the transistors 11L and 12L has turned off, the other turning off, or in the process of the transistors 11L and 12L turning off simultaneously.

A long period from the first rise of the output terminal voltage Vsw to the second rise of the output terminal voltage Vsw results in an increased turn-off loss Eoff (the turn-off loss Eoff will be described later). Accordingly, keeping that period as short as possible or reasonably short helps minimize the turn-off loss Eoff. Also the proportions of the currents in the transistors 11L and 12L in the process of the transition of the switching element 10L from the on state to the off state affects the turn-off loss Eoff. Thus, these factors need to be taken into consideration in setting the time difference dff_Loff to minimize the turn-off loss Eoff.

Figure 17:
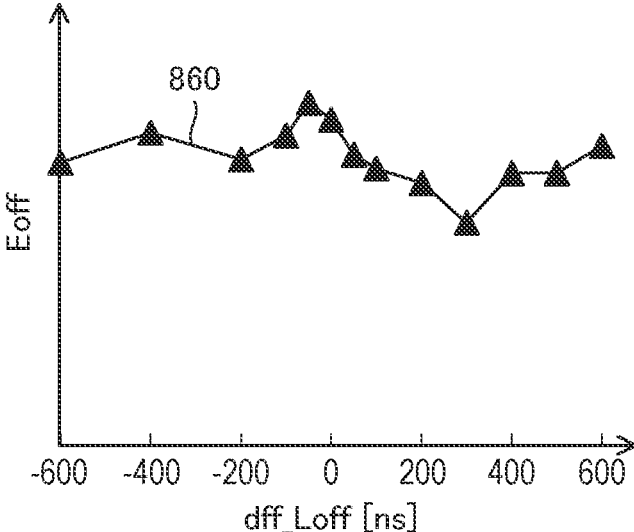
FIG. 17 is a diagram showing a relationship between turn-off loss and turn-off time difference between two transistors in connection with an embodiment of the present disclosure.

In FIG. 17, waveform 860 represents the relationship between the turn-off loss Eoff and the time difference dff_Loff in the turn-off evaluation tests. The turn-off loss Eoff is the switching loss in the switching element 10L at its turning-off. That is, the turn-off loss Eoff is the loss that occurs in the switching element 10L during its transition from the on state to the off state. The turn-off loss Eoff corresponds to the sum of the turn-off loss in the transistor 11L and the turn-off loss in the transistor 12L. The turn-off loss in the transistor 11L is the switching loss that occurs in the transistor 11L during its transition from the on state to the off state. The turn-off loss in the transistor 12L is the switching loss that occurs in the transistor 12L during its transition from the on state to the off state.

It has been found out that, with the combination of the transistors 11L and 12L used in the turn-off evaluation tests of the embodiment, setting the time difference dff_Loff to around +300 minimizes the turn-off loss Eoff. When the time difference dff_Loff is +300 ns (see FIG. 15), first the transistor 11L starts turning off and the drain current Id decreases; so as to compensate for this decrease, the collector current Ic of the transistor 12H increases. When the collector current Ic becomes high enough (in the process of the collector current Ic increasing), the transistor 12L turns off. It has been found out that, in this way, first increasing the proportion of the collector current Ic in the sum current Imath and then turning off the transistor 12L is expected to reduce the turn-off loss Eoff. However, as in the example in FIG. 16, under conditions where the transistor 12L is turned off only after the proportion of the collector current Ic in the sum current Imath has exceeded a predetermined proportion (e.g., 95%), it is difficult to expect a reduced turn-off loss Eoff.

In reality, depending on, among others, the combination of the characteristics of the transistors 11L and 12L, the time difference dff_Loff adequate to minimize the turn-off loss Eoff varies.

The semiconductor device 1 includes the delay circuit 23L, which permits a desired time difference dff_Loff to be secured between the turn-off timings of the transistors 11L and 12L. In practice, at the stage of designing, manufacturing, or shipping of the semiconductor device 1, a time difference dff_Loff that minimizes the turn-off loss Eoff can be determined through tests or the like and the so determined time difference dff_Loff can be used in the delay circuit 23L.

In that case, the delay circuit 23L can set the time difference dff_Loff so as to reduce the switching loss in the switching element 10L at its turning-off as compared with when the time difference dff_Loff is zero (i.e., as compared with when the timings t_L3 and t_L4 shown in FIG. 6 are simultaneous).

To achieve that, when, starting in a state in which via an inductive load (LD) the drain current Id is passing in the transistor 11L and the collector current Ic is passing in the transistor 12L, the transistors 11L and 12L are turned off in response to a second predetermined change (here, a down edge) in the driving control signal LIN, the delay circuit 23L can set the time difference dff_Loff such that first the transistor 11L starts turning off earlier than the transistor 12L to increase the collector current Ic of the transistor 12L and then the transistor 12L turns off when the proportion of the collector current Ic in the sum (Imath) of the drain current Id and the collector current Ic is equal to or less than a predetermined proportion. The predetermined proportion can be set, for example, in a range from 50% to 95%.

In the turn-off evaluation tests, with attention paid to the low-side switching element 10L, the turn-off loss is evaluated; based on the evaluation results, the delay circuit 23L is configured as described above. The high-side delay circuit 27H can be designed similarly.

Specifically, the delay circuit 27H can set the time difference dff_Hoff so as to reduce the switching loss in the switching element 10H at its turning-off (in the following description referred to as the turn-off loss Eoff') as compared with when the time difference dff_Hoff is zero (i.e., as compared with when the timings t_H3 and t_H4 shown in FIG. 5 are simultaneous).

To achieve that, when, starting in a state in which via an inductive load (HD) the drain current is passing in the transistor 11H and the collector current is passing in the transistor 12H, the transistors 11H and 12H are turned off in response to a second predetermined change (here, a down edge) in the driving control signal HIN, the delay circuit 27H can set the time difference dff_Hoff such that first the transistor 11H starts turning off earlier than the transistor 12H to increase the collector current of the transistor 12H and then the transistor 12H turns off when the proportion of the collector current of the transistor 12H in the sum of the drain current of the transistor 11H and the collector current of the transistor 12H is equal to or lower than a predetermined proportion.

The turn-off loss Eoff' is the loss that occurs in the switching element 10H during its transition from the on state to the off state. The turn-off loss Eoff' corresponds to the sum of the turn-off loss in the transistor 11H and the turn-off loss in the transistor 12H. The turn-off loss in the transistor 11H is the switching loss that occurs in the transistor 11H during its transition from the on state to the off state. The turn-off loss in the transistor 12H is the switching loss that occurs in the transistor 12H during its transition from the on state to the off state.

Practical Example 1

In Practical Example 1, the semiconductor device 1 is configured as described below. The switching elements 10H and 10L each include a first to a third element. The first element is the transistor 11H or 11L configured as a MOS-FET. The second element is the transistor 12H or 12L configured as an IGBT. The third element is the diode 13H or 13L that is connected in parallel with the first and second elements.

As mentioned previously, the diode 13H or 13L is a Schottky barrier diode. The diode 13H or 13L may be implemented as a PN-junction diode. Providing a Schottky barrier diode as the diode 13H or 13L helps reduce the switching loss (Eon, Eon') in the switching elements at their turning-on as well as the steady-state loss in the diode during regeneration. The effect of reducing those losses is notable when the transistors 11H and 11L and the diodes 13H and 13L are formed using silicon carbide (SiC).

Practical Example 2

Figure 18:
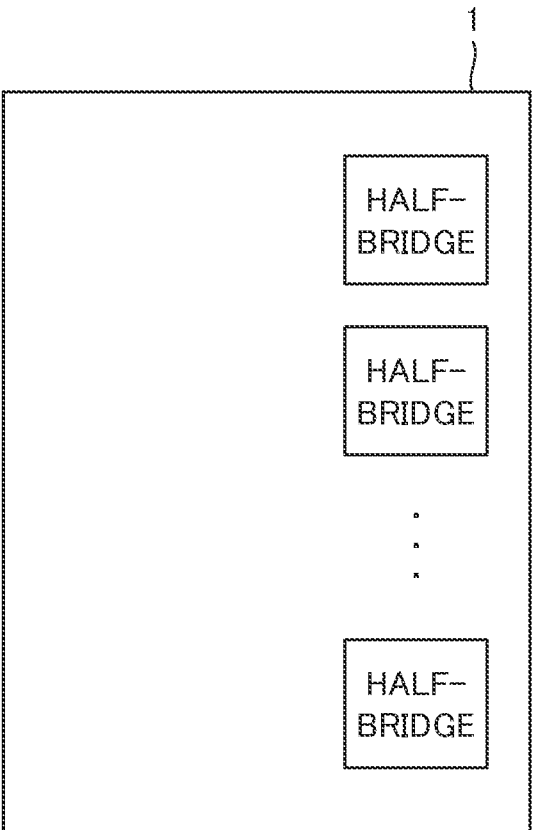
FIG. 18 is a diagram showing a semiconductor device provided with a plurality of half-bridge circuits in connection with an embodiment of the present disclosure.

In Practical Example 2, the semiconductor device 1 is configured as described below. As shown in FIG. 18, the semiconductor device 1 can include a plurality of half-bridge circuits each including the switching elements 10H and 10L. A configuration that includes a plurality of half-bridge circuits can include, for each half-bridge circuit, the drivers 20H and 20L, the boot circuit 30, the gate resistors 41H, 42H, 41L, and 42L, the output terminal TM11, the low-side terminal TM13, the boot terminal TM15, the control input terminals TM16 and TM17, and the capacitor CB. The gate resistors may be omitted (in the following description, the gate resistors are ignored).

Typically, for example, the semiconductor device 1 can include a unit circuit for U phase, a unit circuit for V phase, and a unit circuit for W phase. Each unit circuit includes the half-bridge circuit including the switching elements 10H and 10L, the drivers 20H and 20L, and the boot circuit 30. For each unit circuit, there are provided the output terminal TM11, the low-side terminal TM13, the boot terminal TM15, the control input terminals TM16 and TM17, and the capacitor CB. Here, the load LD can be a three-phase motor provided with a U-phase coil, a V-phase coil, and a W-phase coil. In a configuration where the U-, V-, and W-phase coils are star-connected (Y-connected), one terminal of the U-phase coil, one terminal of the V-phase coil, and one terminal of the W-phase coil can be connected to a U-phase output terminal TM11, a V-phase output terminal TM11, and a W-phase output terminal TM11 respectively, and the other terminal of the U-phase coil, the other terminal of the V-phase coil, and the other terminal of the W-phase coil can be connected together.

Practical Example 3

In Practical Example 3, the semiconductor device 1 is configured as described below.

The high-side driver 20H, which is a driver circuit for the switching element 10H, and the low-side driver 20L, which is a driver circuit for the switching element 10L, each include a control signal generation circuit.

The control signal generation circuit in the high-side driver 20H generates, based on the driving control signal HIN, a control signal CNT_11H for controlling the state of the transistor 11H and a control signal CNT_12H for controlling the state of the transistor 12H. The high-side driver 20H drives the gate of the transistor 11H based on the control signal CNT_11H, and drives the gate of the transistor 12H based on the control signal CNT_12H. In the configuration in FIG. 4, the blocks identified by the reference signs 21H to 27H can be said to constitute the control signal generation circuit in the high-side driver 20H.

The control signal generation circuit in the low-side driver 20L generates, based on the driving control signal LIN, a control signal CNT_11L for controlling the state of the transistor 11L and a control signal CNT_12L for controlling the state of the transistor 12L. The low-side driver 20L drives the gate of the transistor 11L based on the control signal CNT_11L, and drives the gate of the transistor 12L based on the control signal CNT_12L. In the configuration in FIG. 4, the blocks identified by the reference signs 21L to 23L can be said to constitute the control signal generation circuit in the low-side driver 20L.

For any signal or voltage, unless inconsistent with the technical ideas described above, the relationship between its high and low levels may be inverted. Specifically, for example, a configuration is possible where, in response to a down edge in a driving control signal (HIN, LIN), a switching element (10H, 10L) turns on and, in response to an up edge in a driving control signal (HIN, LIN), a switching element (10H, 10L) turns off. The same applies to the relationship among the control signals CNT_H, CNT_11H, and CNT_12H and the transistors 11H and 12H. The same applies also to the relationship among the control signals CNT_L, CNT_11L, and CNT_12L and the transistors 11L and 12L.

The channel types of the FETs (field-effect transistors) mentioned in the embodiments are merely illustrative. Unless inconsistent with the technical ideas described above, the channel type of any FET can be modified between P- and N-channel types. The same applies to any IGBT.

Embodiments of the present disclosure can be modified in many ways as necessary without departure from the scope of the technical ideals defined in the appended claims. The embodiments described herein are merely examples of how the present invention can be implemented, and what is meant by any of the terms used to describe the present invention and its constituent elements is not limited to that mentioned in connection with the embodiments. The specific values mentioned in the above description are merely illustrative and needless to say can be modified to different values.

Notes

To follow are notes on what is disclosed herein, of which specific configuration examples have been presented by way of embodiments above.

According to one aspect of the present disclosure, a semiconductor device (1) includes: a switching element (e.g., 10L) including a parallel connection circuit of a first transistor (e.g., 11L) configured as a field-effect transistor and a second transistor (e.g., 12L) configured as an insulated-gate bipolar transistor; and a driver circuit (e.g., 20L) configured to drive the switching element according to an input control signal (e.g., LIN). When turning the switching element from a first state to a second state, the driver circuit makes different the timing at which the first transistor turns from the first state to the second state and the timing at which the second transistor turns from the first state to the second state. Of the first and second states, one is an off state and the other is an on state. (A first configuration.)

It is thus possible to reduce switching loss.

In the semiconductor device of the first configuration described above, the driver circuit can include a control signal generation circuit (e.g., 21L to 23L) configured to generate, based on the input control signal, a first control signal (e.g., CNT_11L) for controlling the state of the first transistor and a second control signal (e.g., CNT_12L) for controlling the state of the second transistor. The driver circuit can drive the gate of the first transistor based on the first control signal and the gate of the second transistor based on the second control signal. The control signal generation circuit can include a delay circuit (e.g., 23L) configured to make different the timing (e.g., t_L1 or t_L3) of a change in the first control signal based on a change in the input control signal and the timing (e.g., t_L2 or t_L4) of a change in the second control signal based on the change in the input control signal. (A second configuration.)

Providing the delay circuit makes it possible to shift the turn-on or -off timings of the first and second transistors and thereby to reduce switching loss.

In the semiconductor device of the second configuration described above, when turning on the first and second transistors in response to a predetermined change (e.g., a change from low level to high level) in the input control signal, the delay circuit can produce a difference between a first timing (e.g., t_L1) at which a level change is produced in the first control signal to turn on the first transistor based on the predetermined change and a second timing (e.g., t_L2) at which a level change is produced in the second control signal to turn on the second transistor based on the predetermined change. (A third configuration.)

It is thus possible to shift the turn-on timings of the first and second transistors.

In the semiconductor device of the third configuration described above, the delay circuit can produce the difference such that the switching loss (e.g., Eon) in the switching element at its turning-on is lower than if the first and second timings are simultaneous. (A fourth configuration.)

It is thus possible to reduce the switching loss at a turning-on.

In the semiconductor device of the third or fourth configuration described above (see FIG. 9), in a case where, as a result of the first and second transistors turning on, the drain current of the first transistor and the collector current of the second transistor increase, when the first and second transistors are turned on in response to the predetermined change in the input control signal, the delay circuit can produce the difference such that the timing at which the rate of increase of the drain current of the first transistor becomes highest and the timing at which the rate of increase of the collector current of the second transistor becomes highest are simultaneous. (A fifth configuration.)

It is thus possible to reduce the switching loss at a turning-on.

In the semiconductor device of the second configuration described above, when the first and second transistors are turned off in response to a predetermined change (e.g., a change from high level to low level) in the input control signal, the delay circuit can produce a difference between a first timing (e.g., t_L3) at which a level change is produced in the first control signal to turn off the first transistor based on the predetermined change and a second timing (e.g., t_L4) at which a level change is produced in the second control signal to turn off the second transistor based on the predetermined change. (A sixth configuration.)

It is thus possible to shift the turn-off timings of the first and second transistors.

In the semiconductor device of the sixth configuration described above, the delay circuit can produce the difference such that the switching loss (e.g., Eoff) in the switching element at its turning-off is lower than if the first and second timings are simultaneous. (A seventh configuration.)

It is thus possible to reduce the switching loss at a turning-off.

In the semiconductor device of the sixth or seventh configuration described above (see FIG. 15), when, starting in a state in which via an inductive load a drain current is passing in the first transistor and a collector current is passing in the second transistor, the first and second transistors are turned off in response to the predetermined change in the input control signal, the delay circuit can produce the difference such that first the first transistor starts turning off earlier than the second transistor to increase the collector current of the second transistor and thereafter the second transistor turns off when the proportion of the collector current in the sum of the drain current and the collector current is equal to or lower than a predetermined proportion. (An eighth configuration.)

It is thus possible to reduce the switching loss at a turning-off.

The semiconductor device of any of the first to eighth configurations described above can include a plurality of sets of the switching element and the driver circuit. Two switching elements in two sets can be connected in series with each other to constitute a half-bridge circuit. (A ninth configuration.)

In the semiconductor device of the ninth configuration described above, in each set, a Schottky barrier diode (13H, 13L) can be connected in parallel with the second transistor. (A tenth configuration.)

It is thus possible to reduce switching loss and steady-state loss during regeneration in the half-bridge circuit.

In the semiconductor device of the tenth configuration described above, in each set, the first transistor and the Schottky barrier diode can be formed using carbon carbide. (An eleventh configuration.)

This is expected to enhance the effect of reducing switching loss and steady-state loss during regeneration in the half-bridge circuit.

The semiconductor device of any of the first to eleventh configurations described above can include a plurality of the half-bridge circuits. (A twelfth configuration.)

The invention claimed is:

1. A semiconductor device comprising:
   a switching element including a parallel connection circuit of a first transistor configured as a field-effect transistor and a second transistor configured as an insulated-gate bipolar transistor; and
   a driver circuit configured to drive the switching element according to an input control signal,
   wherein when turning the switching element from a first state to a second state, the driver circuit makes different a timing at which the first transistor turns from the first state to the second state and a timing at which the second transistor turns from the first state to the second state, and
   of the first and second states, one is an off state and another is an on state,
   wherein the driver circuit includes a control signal generation circuit configured to generate, based on the input control signal, a first control signal for controlling a state of the first transistor and a second control signal for controlling a state of the second transistor, the driver circuit driving a gate of the first transistor based on the first control signal and a gate of the second transistor based on the second control signal, and
   wherein the control signal generation circuit includes a delay circuit configured to make different a timing of a change in the first control signal based on a change in the input control signal and a timing of a change in the second control signal based on the change in the input control signal.

2. The semiconductor device according to claim 1, wherein
   when turning on the first and second transistors in response to a predetermined change in the input control signal, the delay circuit produces a difference between a first timing at which a level change is produced in the first control signal to turn on the first transistor based on the predetermined change and a second timing at which a level change is produced in the second control signal to turn on the second transistor based on the predetermined change.

3. The semiconductor device according to claim 2, wherein
   the delay circuit produces the difference such that a switching loss in the switching element at a turning-on thereof is lower than if the first and second timings are simultaneous.

4. The semiconductor device according to claim 2, wherein
   in a case where, as a result of the first and second transistors turning on, a drain current of the first transistor and a collector current of the second transistor increase, when the first and second transistors are turned on in response to the predetermined change in the input control signal,
   the delay circuit produces the difference such that a timing at which a rate of increase of the drain current of the first transistor becomes highest and a timing at which a rate of increase of the collector current of the second transistor becomes highest are simultaneous.

5. The semiconductor device according to claim 1, wherein
   when the first and second transistors are turned off in response to a predetermined change in the input control signal, the delay circuit produces a difference between a first timing at which a level change is produced in the first control signal to turn off the first transistor based on the predetermined change and a second timing at which a level change is produced in the second control signal to turn off the second transistor based on the predetermined change.

6. The semiconductor device according to claim 5, wherein the delay circuit produces the difference such that a switching loss in the switching element at a turning-off thereof is lower than if the first and second timings are simultaneous.

7. The semiconductor device according to claim 5, wherein when, starting in a state in which via an inductive load a drain current is passing in the first transistor and a collector current is passing in the second transistor, the first and second transistors are turned off in response to the predetermined change in the input control signal, the delay circuit produces the difference such that first the first transistor starts turning off earlier than the second transistor to increase the collector current of the second transistor and thereafter the second transistor turns off when a proportion of the collector current in a sum of the drain current and the collector current is equal to or lower than a predetermined proportion.

8. The semiconductor device according to claim 1, comprising a plurality of sets of the switching element and the driver circuit, wherein two switching elements in two sets are connected in series with each other to constitute a half-bridge circuit.

9. The semiconductor device according to claim 8, wherein in each set, a Schottky barrier diode is connected in parallel with the second transistor.

10. The semiconductor device according to claim 9, wherein in each set, the first transistor and the Schottky barrier diode are formed using carbon carbide.

11. The semiconductor device according to claim 8, comprising a plurality of the half-bridge circuits.

* * * * *